United States Patent
Zhu et al.

(10) Patent No.: US 9,524,255 B2
(45) Date of Patent: Dec. 20, 2016

(54) SYSTEM AND METHOD FOR AUTOMATIC DQS GATING BASED ON COUNTER SIGNAL

(71) Applicant: Marvell World Trade Ltd., St. Michael (BB)

(72) Inventors: Jun Zhu, San Jose, CA (US); Joseph Jun Cao, Los Gatos, CA (US); Shawn Chen, San Jose, CA (US)

(73) Assignee: MARVELL WORLD TRADE LTD., St. Michael (BB)

( * ) Notice: Subject to any disclaimer, the term of this patent is extended or adjusted under 35 U.S.C. 154(b) by 176 days.

(21) Appl. No.: 14/278,740

(22) Filed: May 15, 2014

(65) Prior Publication Data

US 2014/0359207 A1  Dec. 4, 2014

Related U.S. Application Data

(60) Provisional application No. 61/828,120, filed on May 28, 2013, provisional application No. 61/875,259, filed on Sep. 9, 2013.

(51) Int. Cl.
| | |
|---|---|
| *G06F 13/16* | (2006.01) |
| *G11C 7/10* | (2006.01) |
| *G11C 7/02* | (2006.01) |
| *G11C 11/4076* | (2006.01) |

(Continued)

(52) U.S. Cl.
CPC ............ *G06F 13/1689* (2013.01); *G11C 7/02* (2013.01); *G11C 7/1072* (2013.01); *G11C 11/4076* (2013.01); *G11C 29/023* (2013.01); *G11C 29/028* (2013.01); *G11C 11/4096* (2013.01); *G11C 2207/2254* (2013.01); *G11C 2207/2281* (2013.01)

(58) Field of Classification Search
CPC .. G04F 10/04; G06F 13/1689; G06F 13/4243; G06F 1/04; G06F 3/0232; G06F 11/0793; G06F 11/1024; G06F 11/1048; G06F 7/02
See application file for complete search history.

(56) References Cited

U.S. PATENT DOCUMENTS

| | | | |
|---|---|---|---|
| 7,082,172 B1 * | 7/2006 | Pringle | ................. G01S 7/021 327/280 |
| 7,457,175 B1 | 11/2008 | Griffith et al. | |
| 7,911,857 B1 | 3/2011 | Venkataraman et al. | |

(Continued)

OTHER PUBLICATIONS

International Search Report and Written Opinion dated Dec. 30, 2014 issued in related/corresponding International PCT Patent Appl. No. PCT/IB2014/01772 filed May 15, 2014.

*Primary Examiner* — Thomas Lee
*Assistant Examiner* — Santosh R Poudel

(57) ABSTRACT

Systems and methods for timing read operations with a memory device are provided. A timing signal from the memory device is received at a gating circuit. The timing signal is passed through as a filtered timing signal during a gating window. The gating circuit is configured to open the gating window based on a control signal. The gating circuit is further configured to close the gating window based on a first edge of the timing signal. The first edge is determined based on a counter that is triggered to begin counting by the control signal. At a timing control circuit, the control signal is generated based on i) a count signal from the counter, and ii) a second edge of the timing signal that precedes the first edge in time.

20 Claims, 21 Drawing Sheets

(51) Int. Cl.
  *G11C 29/02*   (2006.01)
  *G11C 11/4096*  (2006.01)

(56) References Cited

U.S. PATENT DOCUMENTS

| | | | | |
|---|---|---|---|---|
| 2002/0172079 | A1* | 11/2002 | Hargis | G06F 13/4086 |
| | | | | 365/193 |
| 2004/0260865 | A1 | 12/2004 | Srinivas et al. | |
| 2007/0002642 | A1 | 1/2007 | Butt et al. | |
| 2009/0034346 | A1* | 2/2009 | Nakashima | G06F 13/1689 |
| | | | | 365/189.15 |
| 2009/0161452 | A1* | 6/2009 | Wang | G11C 7/1078 |
| | | | | 365/193 |
| 2009/0168559 | A1* | 7/2009 | Seo | G06F 13/4072 |
| | | | | 365/189.15 |
| 2012/0324193 | A1 | 12/2012 | Swanson | |
| 2014/0145756 | A1* | 5/2014 | Chong | H03K 19/177 |
| | | | | 326/40 |
| 2014/0269117 | A1* | 9/2014 | Maryan | G11C 7/1087 |
| | | | | 365/193 |

* cited by examiner

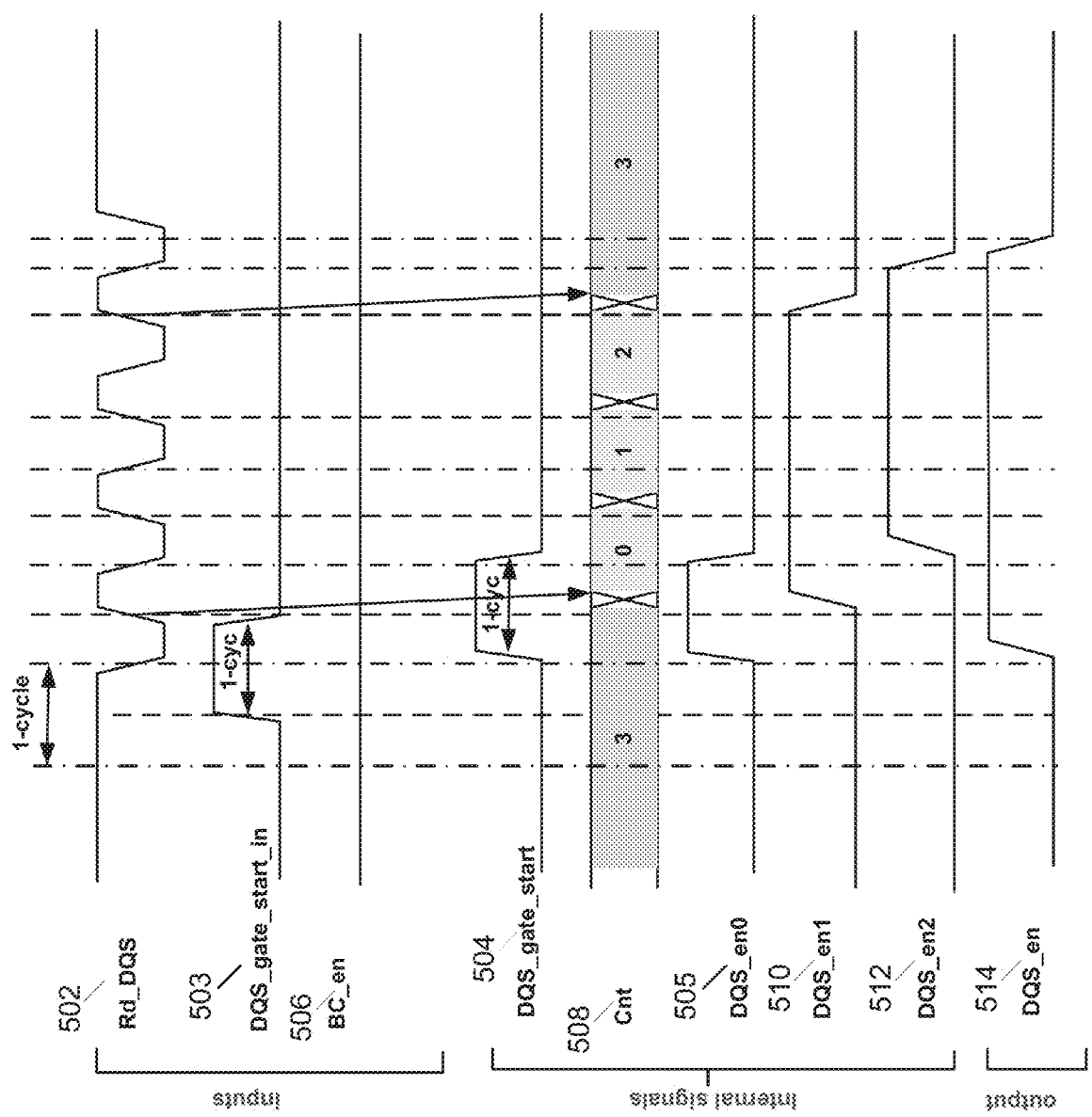

SYSTEM AND METHOD FOR AUTOMATIC DQS GATING BASED ON COUNTER SIGNAL

CROSS-REFERENCE TO RELATED APPLICATIONS

This disclosure claims priority to U.S. Provisional Patent Application No. 61/828,120, filed on May 28, 2013, and to U.S. Provisional Patent Application No. 61/875,259, filed on Sep. 9, 2013, which are incorporated herein by reference in their entireties.

TECHNICAL FIELD

The technology described in this document relates generally to a memory controller and more particularly to a gating circuit configured to gate a timing signal to perform a read operation with a memory device.

BACKGROUND

Synchronous Dynamic Random Access Memory (SDRAM) is a type of Random Access Memory (RAM) used in computing devices. SDRAM comprises both single data rate (SDR) SDRAM and double data rate (DDR) SDRAM. SDR SDRAM transfers data during each period of a timing signal in synchronization with a rising edge of the timing signal. By contrast, DDR SDRAM can achieve nearly twice the bandwidth of SDR SDRAM by transferring data on both rising and falling edges of a timing signal.

To transfer data from an SDRAM memory module to a memory controller, the memory controller initiates a read operation by issuing a read request to the SDRAM memory module. After a period of time has elapsed, the memory module responds by transmitting a data signal along with a timing signal (e.g., a DQ data signal and a DQS data strobe signal) to the memory controller. In some systems, the timing signal undergoes a filtering operation prior to receipt at the memory controller to eliminate signal noise. In response to receiving the timing signal, the memory controller reads the data signal and stores data by registering data on rising or falling edges of the timing signal.

SUMMARY

The present disclosure is directed to systems and methods for timing read operations with a memory device. A system for timing read operations with a memory device includes a gating circuit. The gating circuit is configured to receive a timing signal from the memory device and to pass through the timing signal as a filtered timing signal during a gating window. The gating circuit is configured to open the gating window based on a control signal. The gating circuit is further configured to close the gating window based on a first edge of the timing signal. The first edge is determined based on a counter that is triggered to begin counting by the control signal. The system also includes a timing control circuit configured to generate the control signal based on i) a count signal from the counter, and ii) a second edge of the timing signal that precedes the first edge in time.

In another example, in a method for timing read operations with a memory device, a timing signal from the memory device is received at a gating circuit. The timing signal is passed through as a filtered timing signal during a gating window. The gating circuit is configured to open the gating window based on a control signal. The gating circuit is further configured to close the gating window based on a first edge of the timing signal. The first edge is determined based on a counter that is triggered to begin counting by the control signal. At a timing control circuit, the control signal is generated based on i) a count signal from the counter, and ii) a second edge of the timing signal that precedes the first edge in time.

BRIEF DESCRIPTION OF THE FIGURES

FIG. 4B depicts signals used in performing a read operation between a memory controller and a memory module using a gating circuit.

DETAILED DESCRIPTION

Figure 1:
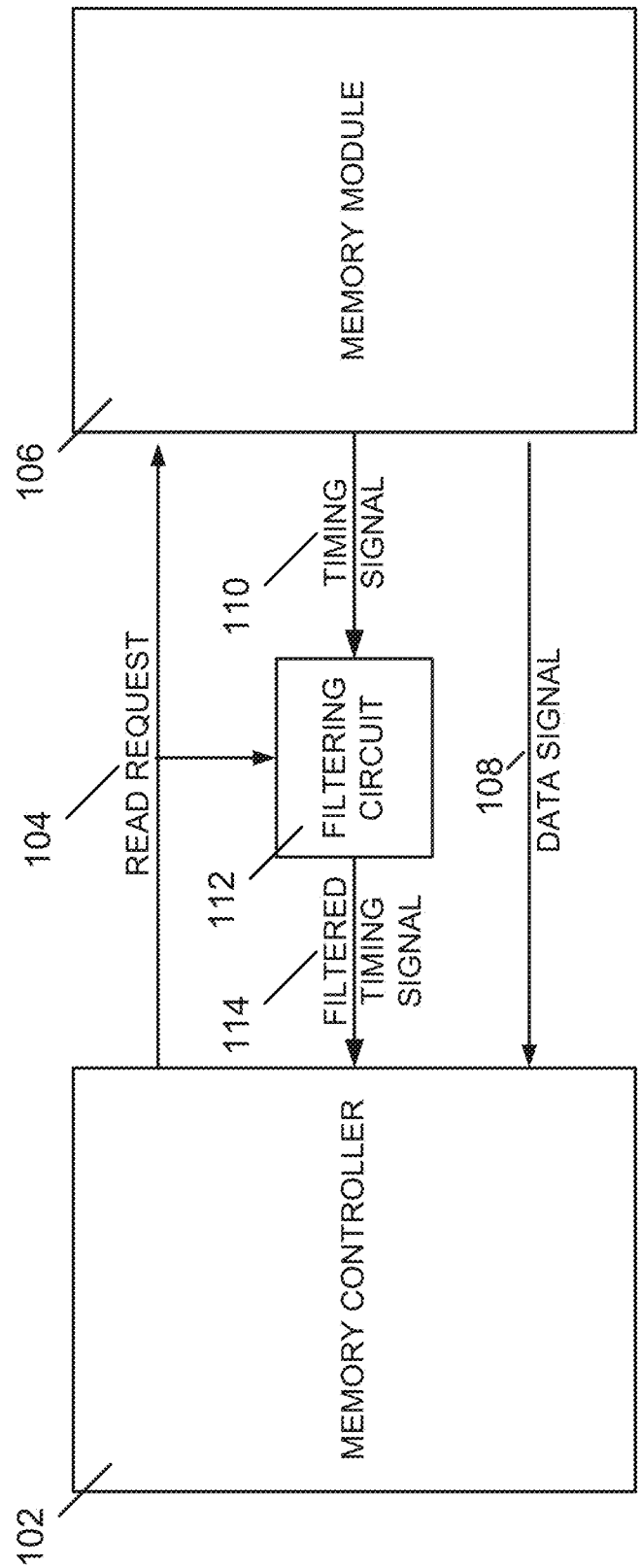
FIG. 1 is a block diagram illustrating a read operation performed between a memory controller and a memory module.

FIG. 1 is a block diagram illustrating a read operation performed between a memory controller 102 and a memory module 106. The read operation is initiated with the memory controller 102 sending a read request 104 to the memory module 106, requesting to read data from a particular address in memory. The memory controller 102 may include, for example, a request 104 by outputting both a data signal 108 and a timing signal 110. The data signal 108 and the timing signal 110 include a DQ signal and a DQS data strobe signal, respectively. The timing signal 110 is used to inform the memory controller 102 that the data signal 108 is ready to be received and to notify the memory controller 102 of the particular timing of the data signal 108. Specifically, the DQS data strobe signal is used to latch input data and drive first-input-first-output (FIFO) logic of the memory controller 102. The input data is latched on both rising and falling edges of the DQS data strobe signal, where the DQS data strobe signal may be single-ended or differential. In an example, the system of FIG. 1 uses DDR VDDQ-terminated DQS gating, accomplished via a pseudo open drain (POD) on-die termination circuit, as explained in further detail below with reference to FIG. 3B. In another example, the system of FIG. 1 uses center-tapped termination (CTT) DQS gating, as explained in further detail below with reference to FIG. 3C.

Figure 2:
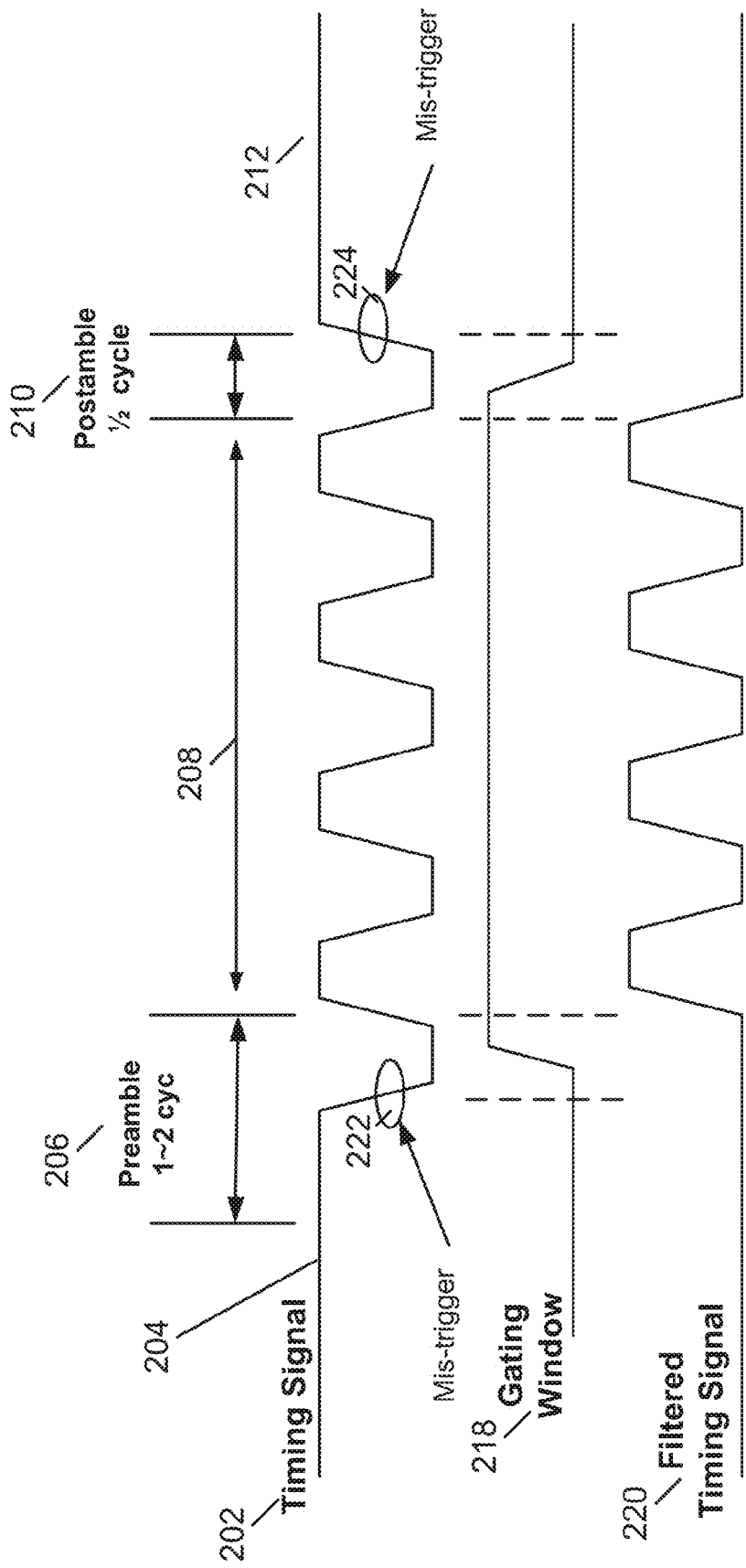
FIG. 2 depicts signals used in performing a read operation between a memory controller and a memory module.

FIG. 2 depicts signals used in performing a read operation between a memory controller and a memory module. As illustrated in FIG. 2, a timing signal 202 contains five distinct regions: termination regions 204, 212, a preamble region 206, a data transfer region 208, and a postamble region 210. Prior to the memory module's receipt of a read request, the timing signal 202 exists at a logic level high voltage of VDDQ within the termination region 204. The logic level high voltage of VDDQ is the input/output VDD supply voltage for the memory controller or the memory module. After receiving the read request, the timing signal 202 enters the preamble region 206 prior to the data transfer region 208. The preamble region 206 is one or two clock cycles in duration, and in the example of FIG. 2, the preamble region 206 is one clock cycle in duration. In order to transfer packets of data within a data signal between the memory module and the memory controller, the timing signal 202 next enters the data transfer region 208. While operating in the data transfer region 208, the timing signal 202 toggles between logic level high and logic level low values. The memory controller uses the toggling timing signal 202 as a reference signal and reads data in the data signal on rising edges or falling edges of the timing signal 202. Following the data transfer region 208 and prior to entering the second termination region 212, the timing signal 202 enters the postamble region 210. The transition from the postamble region 210 to the termination region 212 occurs one half clock cycle after the last edge of valid data within the data transfer region 208 (i.e., the postamble region is one half clock cycle in duration).

With reference again to FIG. 1, a filtering circuit 112 is employed to enable more reliable reading from the memory module 106. Rather than transmitting the timing signal 110 directly from the memory module 106 to the memory controller 102, the timing signal 110 is instead routed through the filtering circuit 112 to eliminate signal noise or to remove portions of the timing signal 110 that could lead to an erroneous data read operation. Thus, after receiving the read request 104, the filtering circuit 112 generates a gating window to act as a filter for the timing signal 110. A filtered timing signal 114, allowed to pass through the open gating window of the filtering circuit 112, is received by the memory controller 102. Although the filtering circuit 112 is depicted in FIG. 1 as being separate from the memory controller 102, in other example systems, the filtering circuit 112 is integrated into the memory controller 102.

As illustrated in FIG. 2, gating window 218 is opened during the preamble region 206 of the timing signal 202 and closed following a last falling edge of the data transfer region 208 (i.e., the gating window is closed within the postamble region 210). The gating window 218 is used to filter noise from the timing signal 202 or to ensure that the termination, preamble, and postamble regions 204, 206, 208, 212 of the timing signal 202 are not read by the memory controller. Thus, a filtered timing signal 220, as illustrated in FIG. 2, contains only the data transfer region 208 of the timing signal 202 and otherwise remains at a logic level low, removing the termination, preamble, and postamble regions 204, 206, 210, 212 that exist prior to and following the transmission of data. Eliminating the termination, preamble, and postamble regions 204, 206, 210, 212 in the filtered timing signal 220 prevents glitches that occur if these regions 204, 206, 210, 212 are allowed to be read by the memory controller. For example, mis-triggers can occur if the memory controller reads portions of the preamble or postamble regions 206, 210 as false signal timing edges. If the portions of the preamble or postamble regions 206, 210 are read as false signal timing edges, such false signal timing edges create triggers that may cause incorrect data to be latched in the memory controller.

Example mis-trigger areas 222, 224 of the timing signal 202 are illustrated in FIG. 2. The mis-trigger areas 222, 224 are not part of the data transfer region 208, and thus, the filtering circuit 112 of FIG. 1 is used to ensure that the edges of these mis-trigger areas 222, 224 are not read by the memory controller 102. As illustrated in FIG. 2, mis-triggers occur at the preamble region 206 and the postamble region 210 of the timing signal 202. As is further illustrated in FIG. 2, there are narrow windows for opening and closing the gating window 218. The window for opening the gating window 218 is approximately one half clock cycle, and the window for closing the gating window 218 is also approximately one half clock cycle. The window for opening the gating window 218 in the VDDQ-terminated timing signal 202 is narrower than that of CTT-terminated timing signals.

Figure 3A:
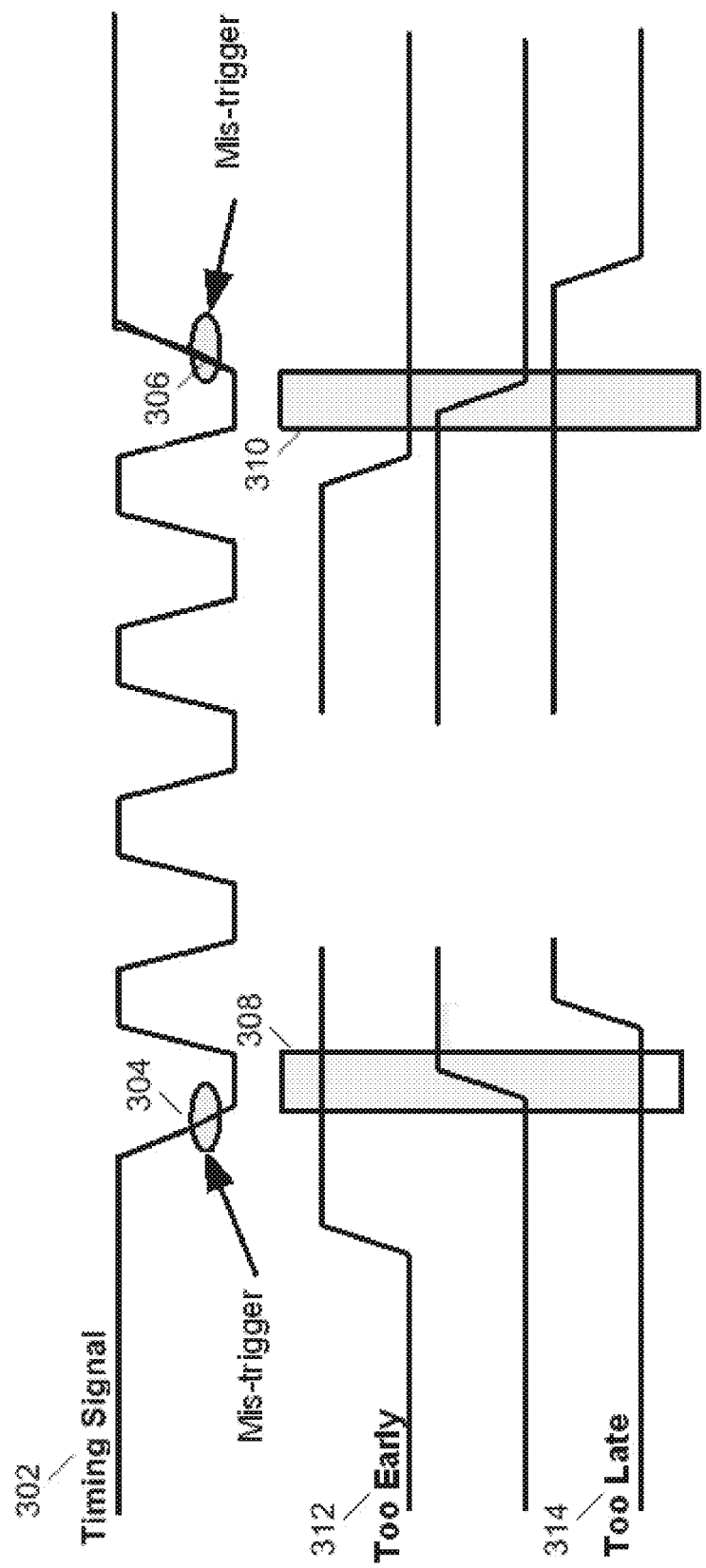
FIG. 3A illustrates aspects of gating a DQS timing signal.

FIG. 3A illustrates aspects of gating a DQS timing signal 302. In FIG. 3A, the DQS timing signal 302 includes the five distinct regions described above (e.g., two termination regions, preamble region, data transfer region, and postamble region). Of particular interest in the DQS timing signal 302 are the transition areas 304, 306, where the timing signal 302 transitions from a logic level high to a logic level low value prior to the data transfer region, and where the timing signal 302 transitions from the logic level low to the logic level high value after the data transfer region, respectively. The areas 304, 306 include edges that can cause glitches if read by a memory controller (e.g., mistriggers caused by interpreting the rising and falling edges as false timing signal edges). To prevent the areas 304, 306 from being read by the memory controller, a gating window is opened and closed within windows 308, 310, respectively.

Gating windows 312 and 314 illustrate gating windows that are opened too early and too late, respectively. In a first portion of the gating window 312, the gating window 312 is opened during the preamble region of the timing signal 302, which allows the falling edge of the area 304 to be read by the memory controller. In a second portion of the gating window 312, the gating window 312 is closed prior to the end of the data transfer region of the timing signal 302, thus causing the last falling edge of the timing signal 302 in the data transfer region to not be read by the memory controller.

The gating window 314 that is opened too late causes similar issues. In a first portion of the gating window 314, the gating window 314 is opened following a first rising edge of the data transfer region of the timing signal 302, thus causing the first rising edge to not be read by the memory controller. In a second portion of the gating window 314, the gating window is closed following the postamble region, thus allowing the rising edge of the area 306 to be read by the memory controller.

When the memory controller reads in either the falling edge or the rising edge of the areas 304, 306, respectively, mistriggers can occur in the memory controller. Thus, to crop out the potential mistriggers, the gating window is opened and closed neither too early nor too late. Generally, the preamble region of a DQS timing signal is 1 to 2 cycles in duration (e.g., 1250 ps two-cycle preamble and 625 ps one-cycle preamble for a 1.6 GHz clock). The postamble region of the DQS timing signal is generally one half cycle in duration. As explained above, the window for both opening and closing the gating window is approximately one half clock cycle in duration, and one half cycle at 1.6 GHz is 312.5 ps, such that gate control is challenging. Gate control may be especially challenging due to voltage and temperature (VT) corners and multi-rank effects.

Figure 3B:
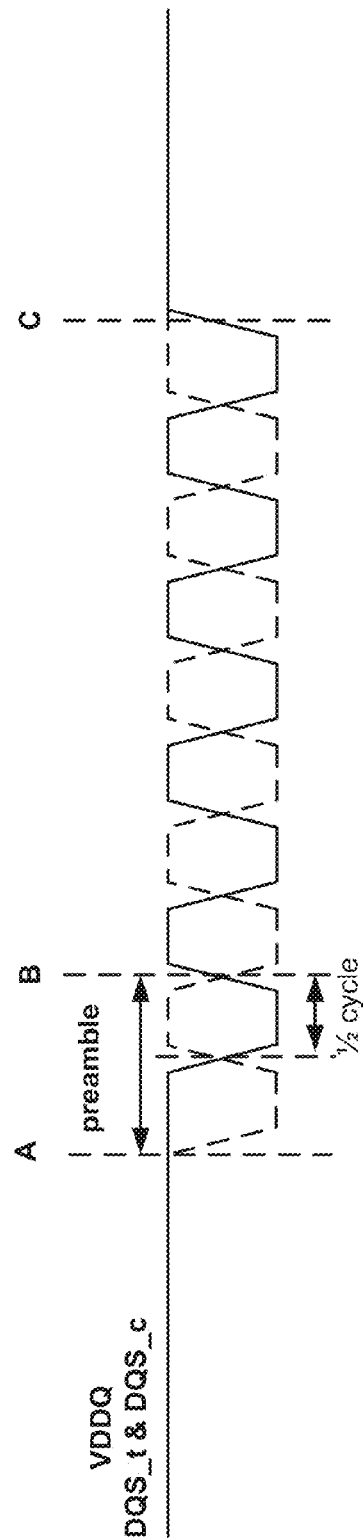
FIGS. 3B and 3C depict timing signals generated by pseudo open drain (POD) and center tap terminated (CTT) circuits, respectively.
Figure 3C:
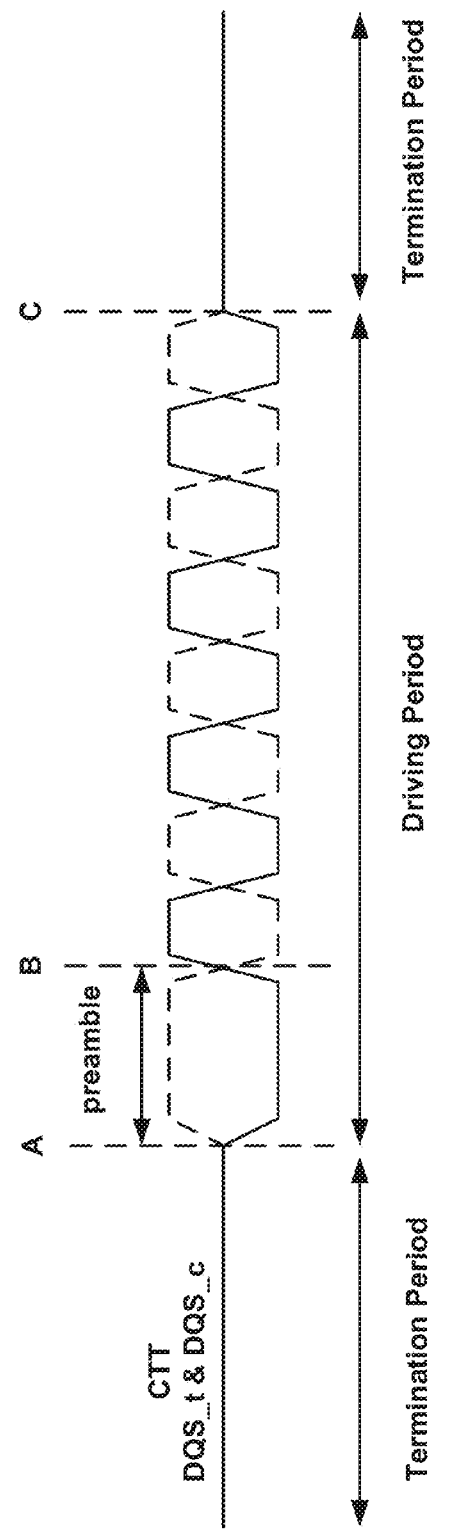
Figure 3E:
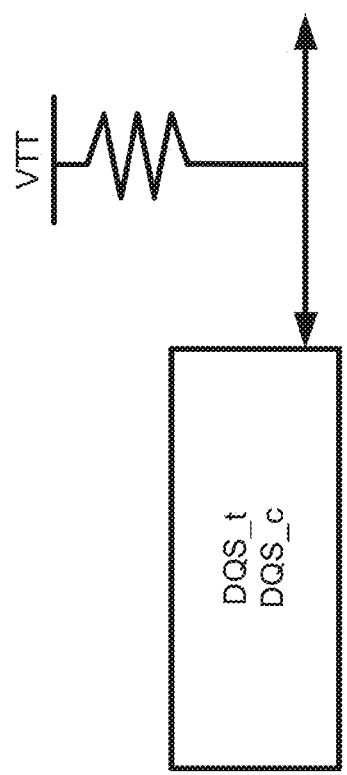
FIGS. 3D and 3E depict POD and CTT circuits, respectively.
Figure 3D:
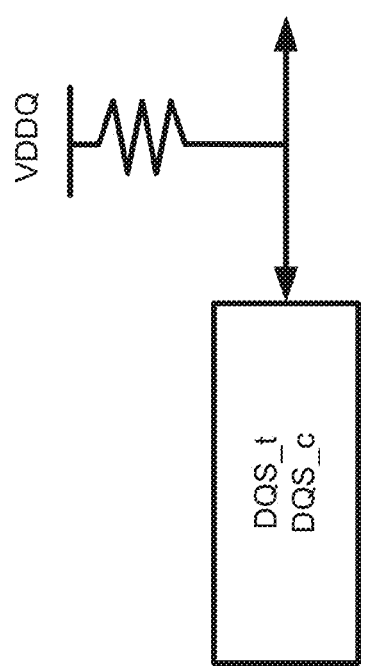

FIGS. 3B and 3C depict timing signals generated by pseudo open drain (POD) and center-tap terminated (CTT) circuits, respectively. The timing signal of FIG. 3B is a VDDQ-terminated DQS signal that is used in DDR4 and future DDR devices that utilize POD on-die termination circuitry to terminate the timing signal at a VDDQ level. As illustrated in the example of FIG. 3B, the VDDQ-terminated timing signal is a differential signal including two complementary signals, DQS_t and DQS_c. During non-driving periods (e.g., termination periods 204, 212 outside of the data transfer region 208, as illustrated in FIG. 2), the signals DQS_t and DQS_c are terminated by a POD circuit and pulled high to a logic level high voltage of VDDQ (e.g., input/output VDD supply voltage for the memory controller or memory device). During the driving period (e.g., the data transfer region 208, as illustrated in FIG. 2), the signals DQS_t and DQS_c alternate between logic level high and low values. An example POD circuit for pulling the signals DQS_t and DQS_c to the logic level high voltage of VDDQ is illustrated in FIG. 3D.

The timing signal of FIG. 3C is a CTT-terminated DQS signal that is used in DDR3 and other DDR devices that utilize CTT termination circuitry to terminate the timing signal at a VTT level. In the example of DDR3, the VTT level is equal to one half of VDDQ. As illustrated in the example of FIG. 3C, the CTT-terminated timing signal is a differential signal including two complementary signals, DQS_t and DQS_c. During non-driving termination periods, the signals DQS_t and DQS_c are terminated by a CTT circuit to the VTT termination voltage. The VTT termination voltage causes the DQS_t and DQS_c signals to be in a high impedance state, also known as a tri-state region. While operating in the tri-state region, the DQS_t and DQS_c timing signals are of indeterminate values, neither logic level high nor logic level low (i.e., a "high-z" level). During the driving period, the signals DQS_t and DQS_c alternate between logic level high and low values. An example CTT circuit for pulling the signals DQS_t and DQS_c to the VTT termination voltage is illustrated in FIG. 3E. Although features of the disclosure are applicable to both VDDQ-terminated and CTT-terminated DQS gating, the examples of FIGS. 4A-17 are presented in the context of VDDQ-terminated DQS gating.

Figure 4A:
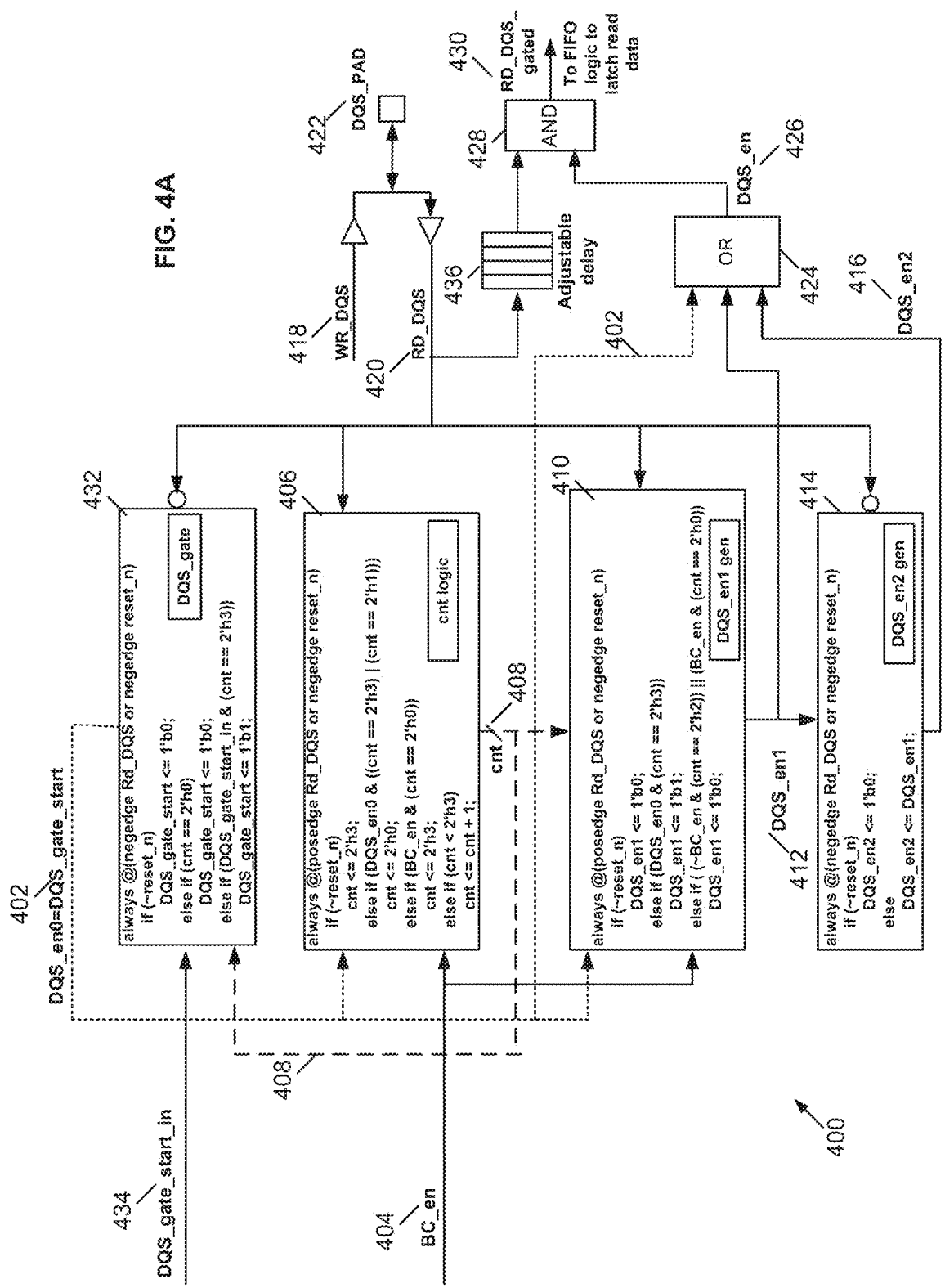
FIG. 4A depicts an example circuit for performing DQS gating control in a memory device.

FIG. 4A depicts an example circuit 400 for performing DQS gating control. The gating circuit of FIG. 4A is configured to receive a timing signal 420 ("RD_DQS") from the memory device and to pass through the timing signal 420 as a filtered timing signal 430 ("RD_DQS gated") during a gating window 426 ("DQS_en"). The circuit 400 accomplishes this by opening the gating window 426 based on a control signal 402 ("DQS_gate_start" or "DQS_en0") and by closing the gating window 426 automatically, based on a falling edge of the timing signal 420. By operating in this manner, only preamble gating control is needed, because the gating window 426 is configured to close automatically (i.e., based on a self-control principle). As explained in further detail below, the circuit 400 supports a two-cycle preamble configuration, thus allowing the circuit 400 to utilize fully the two-cycle preamble window for adjusting the control signal 402 used to open the gating window 426.

As noted above, in FIG. 4A, the gating window 426 is closed automatically, based on a falling edge of the timing signal 420. The falling edge is determined based on a counter 406 ("cnt logic") that is triggered to begin counting by the control signal 402. Along with the counter 406, the gating circuit of FIG. 4A further includes a first module 410 ("DQS_en1 gen") configured to generate a first intermediate signal 412 ("DQS_en1") based on one or more of the control signal 402, a count signal 408 ("cnt") from the counter 406, and the timing signal 420, where the first module 410 is triggered by rising edges of the timing signal 420. The gating circuit of FIG. 4A also includes a second module 414 ("DQS_en2 gen") configured to generate a second intermediate signal 416 ("DQS_en2") based on the first intermediate signal 412 and the timing signal 420, where the second module 414 is triggered by falling edges of the timing signal 420. The gating circuit also includes a third module 424 configured to generate the gating window 426 based on the control signal 402, the first intermediate signal 412, and the second intermediate signal 416. As depicted in FIG. 4A, the third module 424 is implemented with an "OR" logic module (e.g., an "OR" logic gate). Further, the filtered timing signal 430 is produced by an "AND" module 428, which performs an "AND" operation on the timing signal 420 and the gating window 426.

The circuit 400 of FIG. 4A also includes a timing control circuit 432 that is used to generate the control signal 402. The timing control circuit 432 generates the control signal 402 based on the timing signal 420, the count signal 408, and a DQS_gate_start_in signal 434. As explained in further detail below, with reference to FIG. 4B, the DQS_gate_start_in signal 434 includes a pulse that is produced following the issuance of the read command by the memory controller. In an example, the pulse is produced by a memory device or a memory controller in response to the read command (e.g., memory module 106 or memory controller 102, as depicted in FIG. 1). In another example, the pulse is produced by the timing control circuit 432 in response to the read command. In yet another example, the pulse is produced by a portion of the filtering circuit or gating circuit (e.g., filtering circuit 112 as depicted in FIG. 1 or various portions of the gating circuit depicted in FIG. 4A). Based on this pulse and the count and timing signals 408, 420, the timing control circuit 432 generates the control signal 402 utilized by the counter 406, first module 410, and third module 424.

The circuit 400 of FIG. 4A further includes a delay module 436. As explained in further detail below, with reference to FIG. 5, the delay module 436 is configured to delay the timing signal 420 prior to filtering the timing signal 420 using the gating window 426 at the "AND" module 428.

The timing signal 420 is delayed based on an amount of time between a falling edge of the timing signal 420 and the opening of the gating window 426. The delay module 436 is an adjustable delay module, such that the amount of time by which the timing signal 420 is delayed is adjustable. As illustrated in FIG. 4A, portions of the circuit 400 receive the timing signal 420 that is not delayed (i.e., the counter 406, the first module 410, the second module 414, the timing control circuit 432) and the "AND" module 428 receives the timing signal 420 that has been delayed by the delay module 436.

FIG. 4B depicts signals used in performing a read operation between a memory controller and a memory module using a gating circuit (e.g., the gating circuit of FIG. 4A). A timing signal 502 ("Rd_DQS") in FIG. 4B includes a one-cycle preamble region, four-cycle data transfer region, one half cycle postamble region, and termination regions preceding and following the preamble and postamble regions, respectively. The timing signal 502 of FIG. 4B corresponds to the timing signal 420 of FIG. 4A. As is further illustrated in FIG. 4B, a DQS_gate_start_in signal 503 includes a one-cycle pulse. The one-cycle pulse of the DQS_gate_start_in signal 503 is produced following the issuance of a read command from the memory controller. Based on this pulse, the timing signal 502, and a count signal 508, a timing control circuit (e.g., the timing control circuit 432 of FIG. 4A) generates a control signal 504. The DQS_gate_start_in signal 503 of FIG. 4B corresponds to the DQS_gate_start_in signal 434 of FIG. 4A.

The control signal 504 (e.g., the "DQS_gate_start" signal generated by the timing control circuit) is a signal that includes a pulse that is one cycle in duration and that corresponds to a single "READ" command. The timing control circuit issues the control signal 504 such that a rising edge of the pulse of the control signal 504 is configured to occur within a logic level low portion of the preamble region of the timing signal 502. The control signal 504 of FIG. 4B corresponds to the control signal 402 of FIG. 4A (i.e., "DQS_gate_start") and is used to open a gating window 514 ("DQS_en"). A DQS_en0 signal 505 is equivalent to the control signal 504. This can be seen in FIG. 4A, which depicts "DQS_en0=DQS_gate_start" at 402.

The logic used to implement the control signal 504 and the DQS_en0 signal 505 of FIG. 4B is illustrated in FIG. 4A. In the circuit of FIG. 4A, the timing control circuit 432 receives inputs including the DQS_gate_start_in signal 434, timing signal 420, and count signal ("Cnt") 408. In response to these inputs, the timing control circuit 432 produces the control signal 402 (i.e., DQS_gate_start, which is equivalent to the DQS_en0 signal) based on logic employed by the timing control circuit 432. Specifically, as illustrated in FIG. 4A, the particular logic used to implement the functions of the timing control circuit 432 is as follows:

```
always @(negedge Rd_DQS or negedge reset_n)
    if (~reset_n)
        DQS_gate_start <= 1'b0;
    else if (cnt == 2'h0)
        DQS_gate_start <= 1'b0;
    else if (DQS_gate_start_in & (cnt == 2'h3))
        DQS_gate_start <= 1'b1;
```

The statement "always @(negedge Rd_DQS or negedge reset_n)" causes the timing control circuit 432 to be triggered by falling (i.e., negative) edges of the Rd_DQS timing signal 420 or by a falling edge of a reset signal, "reset_n." Thus, the "if" and "else if" statements of the logic used to implement the timing control circuit 432 are evaluated upon falling edges of the timing signal 420 or falling edges of the reset signal, "reset_n."

If the "reset_n" is detected to be at a logic level low (as implemented by the statement "if (~reset_n)" above), the control signal 402 is set to "0" (i.e., a logic level low value) ("DQS_gate_start<=1'b0;"). The statement "else if (cnt==2'h0)" sets the control signal 402 to "0" ("DQS_gate_start<=1'b0;") if the received count signal 408 is equal to "0." Thus, if the timing signal 420 is transitioning from high to low and the count signal 408 is equal to "0" during this transitioning, the control signal 402 is set equal to "0." If the previously described "if" and "else if" statements are not true, the statement "else if (DQS_gate_start_in & (cnt==2'h3))" sets the control signal to "1" (i.e., a logic level high value) ("DQS_gate_start c=1'b1;") if the DQS_gate_start_in signal 434 is high and the count signal 408 is equal to "3." Based on the logic employed by the timing control circuit 432, the control signal 402 is delayed as compared to the DQS_gate_start_in signal 434. Thus, the timing control circuit 432 generates the control signal 402 based on a read request (i.e., the read request that causes the DQS_gate_start_in signal 434 to be generated), a falling edge of the timing signal 420, and a count signal 408 from the counter 406.

With reference again to FIG. 4B, a "BC_EN" signal 506 is at a logic level low in the example of FIG. 4B. The BC_EN signal 506 is a full-burst size wide signal used to indicate to the gating circuit that a current read command is a burst chop command or a full burst command. For example, for DDR3 and DDR4 memory, there are BL8 and BC4 commands. When a command is BL8 (full burst of eight command), the BC_EN signal 506 is low, and when a command is BC4 (burst chop 4), the BC_EN signal 506 is high. The BC_EN signal 506 can be a multi-bit signal that indicates additional combinations of burst chopping. The BC_EN signal 506 of FIG. 4B corresponds to the BC_EN signal 404 of FIG. 4A.

A count signal 508 ("Cnt") is a signal produced by a 2-bit, 3-bit, or 4-bit counter that is driven by the timing signal 502. In response to changes in the timing signal 502, the count signal 508 counts up from a value of "0" to a value of "3." The count signal 508 is configured to start counting based on the control signal 504, as explained in further detail below. The count signal 508 of FIG. 4B corresponds to the count signal 408 of FIG. 4A. As illustrated in FIG. 4B, the count signal 508 is configured to maintain a steady-state counter value of "3" during periods of time in which a read operation is not taking place (i.e., during the termination regions of the timing signal 502). As is also illustrated in FIG. 4B, the count signal 508 is triggered to rising edges of the timing signal 502. Thus, following the preamble region of the timing signal 502, a first rising edge of the timing signal 502 causes the counter to reset its count signal 508 from a value of "3" to a value of "0." A second rising edge of the timing signal 502 increments the count signal 508 to a value of "1," and so on. A fourth rising edge of the timing signal 502 resets the count signal 508 to the steady-state value of "3."

Because a single read command from the memory controller causes the data transfer region of the timing signal 502 to have four rising edges, the incrementing of the count signal 508 is used to determine when to close the gating window 514. For example, as explained in detail below, a module used to produce the gating window 514 is configured to close after a particular falling edge of the timing signal 502, and the particular falling edge is determined based on the count signal 508. The closing of the gating window 514 is triggered by the last falling edge of the timing signal 502, such that the closing of the gating window 514 always lags behind the last falling edge of the timing signal 502 but not by a significant amount of time. The relatively small amount of time between the last falling edge of the timing signal 502 and the closing of the gating window 514 causes the gating window 514 to automatically close in the postamble region of the timing signal 502, without a need for a specific signal to close the gating window 514 (i.e., the gating window 514 is closed automatically, and a second control signal is not used in closing the gating window 514).

The logic used to implement the count signal 508 of FIG. 4B is illustrated in FIG. 4A. In the gating circuit of FIG. 4A, the counter 406 receives inputs including the control signal 402, the BC_EN signal 404, and the timing signal 420. In response to these inputs, the counter 406 produces the count signal 408 based on logic employed by the counter 406. Specifically, as illustrated in FIG. 4A, the particular logic used to implement the functions of the counter 406 is as follows:

```
always @(posedge Rd_DQS or negedge reset _n)
    if (~reset _n)
        cnt <=2'h3;
    else if (DQS_en0 & ((cnt == 2'h3) | (cnt == 2'h1)))
        cnt <= 2'h0;
    else if (BC_en & (cnt == 2'h0))
        cnt <= 2'h3;
    else if (cnt < 2'h3)
        cnt <= cnt + 1;
```

The statement "always @(posedge Rd_DQS or negedge reset_n)" causes the counter 406 to be triggered by rising (i.e., positive) edges of the Rd_DQS timing signal 420 or by a falling (i.e., negative) edge of a reset signal, "reset_n." Thus, the "if" and "else if" statements of the logic used to implement the counter 406 are evaluated upon rising edges of the timing signal 420 or falling edges of the reset signal, "reset_n."

If the "reset_n" is detected to be at a logic level low (as implemented by the statement "if (~reset_n)" above), the count signal 408 returns to the steady state value of "3" ("cnt<=2'h3;"). The statement "else if (DQS_en0 & ((cnt==2'h3)|(cnt==2'h1)))" resets the count value 408 to a value of "0" ("cnt<=2'h0;"), a lowest value for the counter 406, if it is detected that the control signal 402 is high and the count value 408 has a value of "3" or "1." This statement reflects the fact that the counter 406 is triggered to begin counting by the control signal 402, where the control signal 402 is configured to be at a logic level high following issuance of a read command by the memory controller. The count values of "3" and "1" used in the "else if" statement allow the gating circuit of FIG. 4A to support normal read operations (i.e., those read operations that occur during a termination region of the timing signal 402) and read interrupt operations (i.e., those read operations that occur during the data transfer region of the timing signal 402 and that interrupt a previous read operation). The statement "else if (BC_en & (cnt==2'h0))" sets the count value 408 to a value of "3" ("cnt<=2'h3;") if the BC_EN signal 404 is high and the count value 408 has a value of "0." The BC_EN signal 404 is used to indicate to the gating circuit that a current read command is a burst chop command. If the previously described "if" and "else if" statements are not true, the "else if (cnt<2'h3)" statement increments the count value 408 when the count value 408 has a value of less than "3" ("cnt<=cnt+1;").

With reference again to FIG. 4B, first and second intermediate signals 510, 512 ("DQS_en1" and "DQS_en2, respectively") are used in implementing the gating window 514 that closes automatically following the particular falling edge of the timing signal 502. The first intermediate signal 510 is triggered based on rising edges of the timing signal 502 and transitions from a logic level low to a logic level high value when the count signal 508 has a value of "3" and the control signal 504 is at a logic level high. The first intermediate signal 510 goes low when the count signal 508 has a value of "2." The second intermediate signal 512 is triggered based on falling edges of the timing signal 502 and follows the value of the first intermediate signal 510. However, because the first intermediate signal 510 is triggered based on the rising edges of the timing signal 502, and because the second intermediate signal 512 is triggered based on the falling edges of the timing signal 502, the second intermediate signal 512 lags behind the first intermediate signal 510 by approximately one half cycle.

The intermediate signals 510, 512, correspond to the first and the second intermediate signals 412, 416 of FIG. 4A and serve as inputs to an "OR" logic module, along with the control signal 504. The output of the "OR" logic module is the gating window 514. These aspects of FIG. 4B are illustrated in the gating circuit of FIG. 4A, where the control signal 402 and the first and second intermediate signals 412, 416 produced by the first and second modules 410, 414 are inputs to the third module 424. The third module 424 implements an "OR" logic operation to produce the gating window 426.

The logic used to implement the first intermediate signal 510 of FIG. 4B is illustrated in FIG. 4A. In the gating circuit of FIG. 4A, the first module 410 receives inputs including the count signal 408, the timing signal 420, the control signal 402, and the BC_EN signal 404. In response to these inputs, the first module 410 produces the first intermediate signal 412 based on logic employed by the first module 410. Specifically, as illustrated in FIG. 4A, the particular logic used to implement the functions of the first module 410 is as follows:

```
always @(posedge Rd_DQS or negedge reset _n)
    if (~reset _n)
        DQS_en1 <= 1'b0;
    else if (DQS_en0 & (cnt == 2'h3))
        DQS_en1 <= 1'b1;
    else if ((~BC_en & (cnt == 2'h2)) | | (BC_en & (cnt == 2'h0))
        DQS_en1 <= 1'b0;
```

The statement "always @(posedge Rd_DQS or negedge reset_n)" causes the first module 410 to be triggered by rising edges of the Rd_DQS timing signal 420 or by a falling edge of the reset signal "reset_n."

If the "reset_n signal" is detected to be at a logic level low (as implemented by the statement "if (~reset_n)" above), the first intermediate signal 412 is set at a logic level low ("DQS_en1<=1'b0;"). The statement "else if (DQS_en0 & (cnt==2'h3))" sets the first intermediate signal 412 to a logic level high ("DQS_en1<=1'b1;") if it is detected that the control signal 402 is high and the count value 408 has a value of "3." The statement "else if ((~BC_en & (cnt==2'h2))||(BC_en & (cnt==2'h0))" sets the first intermediate signal 412 to a logic level low ("DQS_en1<=1'b0;") if the BC_EN signal 404 is low and the count signal 408 has a value of "2" or if the BC_EN signal 404 is high and the count signal 408 has a value of "0."

The logic used to implement the second intermediate signal 512 of FIG. 4B is illustrated in FIG. 4A. In the gating circuit of FIG. 4A, the second module 414 receives inputs including the first intermediate signal 412 and the timing signal 420. In response to these inputs, the second module 414 produces the second intermediate signal 416 based on logic employed by the second module 414. Specifically, as illustrated in FIG. 4A, the particular logic used to implement the functions of the second module 414 is as follows:

```
always @(negedge Rd_DQS or negedge reset _n)
    if (~reset _n)
        DQS_en2 <= 1'b0;
    else
        DQS_en2 <= DQS_en1;
```

The statement "always @(negedge Rd_DQS or negedge reset_n)" causes the second module 414 to be triggered by falling edges (i.e., negative edges) of the Rd_DQS timing signal 420 or by a falling edge of the reset signal "reset_n."

If the "reset_n" signal is detected to be at a logic level low (as implemented by the statement "if (~reset_n)" above), the second intermediate signal 416 is set at a logic level low ("DQS_en2<=1'b0;"). The "else" statement causes the second intermediate signal 416 to have a value equal to that of the first intermediate signal 412 ("DQS_en2<=DQS_en1;"). Because the first intermediate signal 412 is triggered based on rising edges of the timing signal 420, and because the second intermediate signal 416 is triggered based on falling edges of the timing signal 420, the second intermediate signal 416 lags behind the first intermediate signal 412 by approximately one half cycle.

As explained above, the gating circuit of FIG. 4A also includes the third module 424 configured to generate the gating window 426 based on the control signal 402 and the first and second intermediate signals 412, 416 (e.g., via an "OR" logic module, as illustrated in FIG. 4A). The gating window 426 is configured to close after the last falling edge of the timing signal 420, and the last falling edge is determined based on the count signal 408. The closing of the gating window 426 lags behind the last falling edge of the timing signal 420 but not by a significant amount of time. The relatively small amount of time between the last falling edge of the timing signal 420 and the closing of the gating window 426 allows the gating window 426 to close in the postamble region of the timing signal 420.

The filtered timing signal 430 is produced by the "AND" logic module 428, which performs an "AND" operation on the timing signal 420 and the gating window 426 (i.e., the timing signal 420 is reproduced in the filtered timing signal 430 during periods of time in which the gating window 426 is at a logic level high value). The filtered timing signal 430 is input to first-input-first-output ("FIFO") logic of the memory controller that issued the read command and is used to latch data in the memory controller. The gating circuit of FIG. 4A also receives a timing signal for a write operation 418 ("WR_DQS"). Both the timing signal for the read operation 420 and the timing signal for the write operation 418 are received via a DQS pad 422.

As explained in further detail below through exemplary signal timing diagrams (e.g., signal timing diagrams 1400-1600 of FIGS. 14-16), the circuit 400 of FIG. 4A can be used to implement features including read interrupt functionality and burst chop functionality. The circuit 400 also supports a two-cycle preamble configuration and allows the two-cycle preamble window to be fully utilized for adjusting the timing of the DQS_gate_start_in signal 434. A duration of the pulse of the DQS_gate_start_in signal 434 is configured based on the length of the preamble of the timing signal 420, such that for a one-cycle preamble, the pulse of the DQS_gate_start_in signal 434 is one cycle in width, and for a two-cycle preamble, the pulse of the DQS_gate_start_in signal 434 is two cycles in width.

Figure 5:
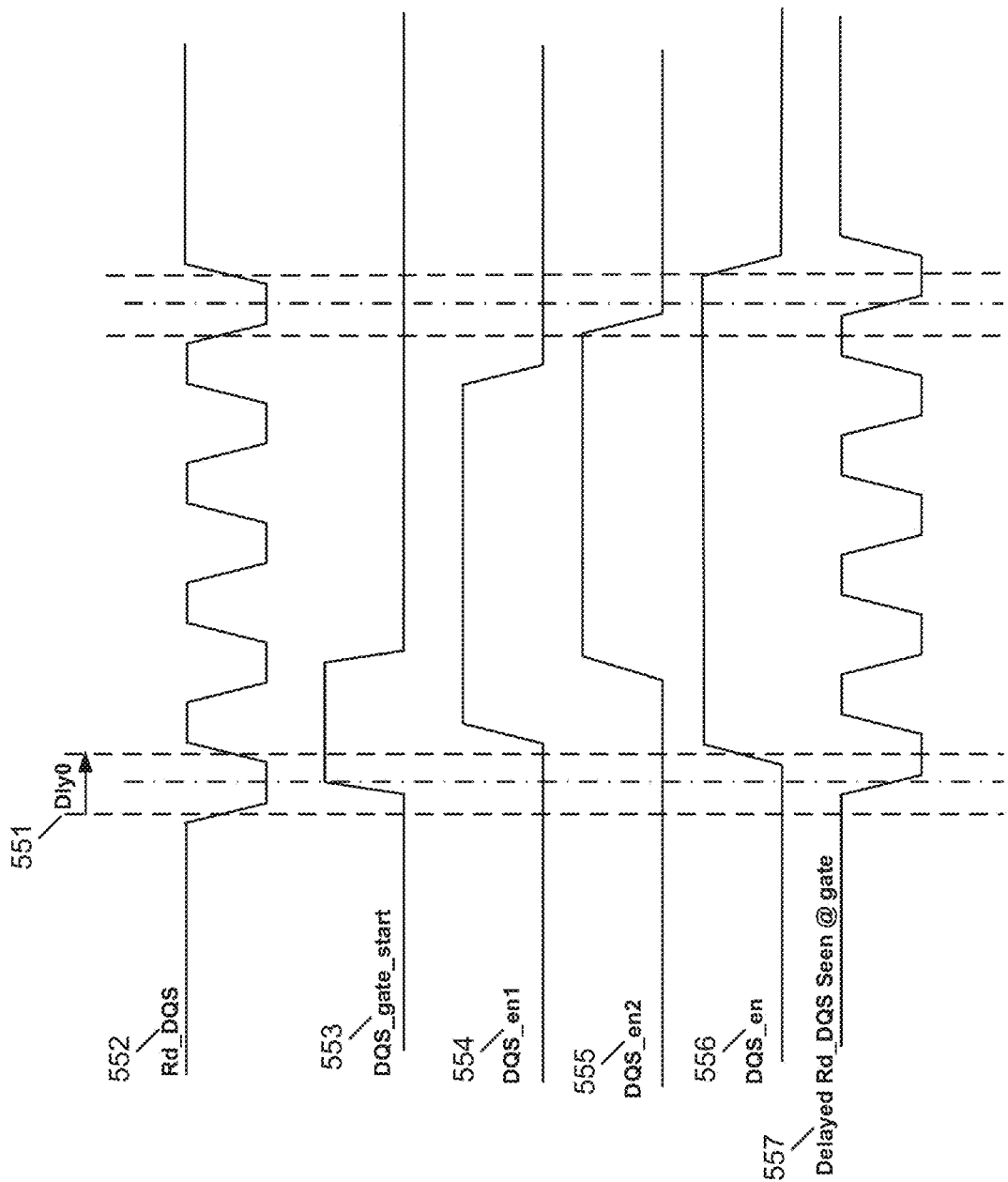
FIG. 5 depicts an example signal timing diagram that illustrates a delay incurred in opening a gating window.

FIG. 5 depicts an example signal timing diagram that illustrates a delay (Dly0) 551 incurred in opening a gating window. The gating circuit of FIG. 4A includes the delay module 436, and aspects of the delay module 436 are illustrated in FIG. 5. In FIG. 5, a timing signal 552 ("Rd_DQS") is used as a clock to generate the gating window 556 ("DQS_en"). For example, the gating window 556 is opened based on a control signal 553 ("DQS_gate_start"), and the control signal 553 is generated in response to negative edges of the timing signal 552. Similarly, the gating window 556 is closed based on first and second intermediate signals 554, 555 ("DQS_en1" and "DQS_en2"), and these intermediate signals 554, 555 are timed based on rising and falling edges, respectively, of the timing signal 552.

In generating the gating window 556 based on the timing signal 552, there are several levels of logic in the timing path. For example, the control signal 553 transitions from a logic level low to a logic level high value based on the first falling edge of the timing signal 552. Only after the control signal 553 transitions from the logic level low to the logic level high value can the gating window 556 have a logic level high value (e.g., as explained above with reference to FIGS. 4A and 4B). Thus, there is a delay between the first falling edge of the timing signal 552 and the opening of the gating window 556. This delay is illustrated by the delay (Dly0) 551 in FIG. 5.

In order to account for the delay 551, the timing signal 552 is delayed using an adjustable delay module to generate a delayed timing signal 557. The adjustable delay module is configured to delay the timing signal 552 prior to the receipt of the timing signal 552 at a gating module (i.e., the "AND" logic module 428 of FIG. 4A). Delaying the timing signal 552 in this manner is used to ensure that the gating window 556 is opened and closed at the correct points of time within the preamble and postamble regions, respectively, of the delayed timing signal 557. In an example, the timing signal 552 is delayed based on an amount of time between a falling edge of the timing signal 552 and the opening of the gating window 556, where this amount of time is represented by the delay 551 in FIG. 5.

The delay 551 is in the range of several hundred picoseconds (e.g., 200 ps). According to specifications for DDR devices and considering clock jitter that is present in the DDR devices, the window for opening and closing the gating window 556 can be as small as 0.3 tCK. With a clock speed of 1.6 GHz, the window for opening and closing the gating window 556 can thus be on the order of 187.5 ps. In order to ensure that the gating window 556 opens and closes within the necessary regions of the timing signal 552, the delay is introduced to generate the delayed timing signal 557.

Figure 6:
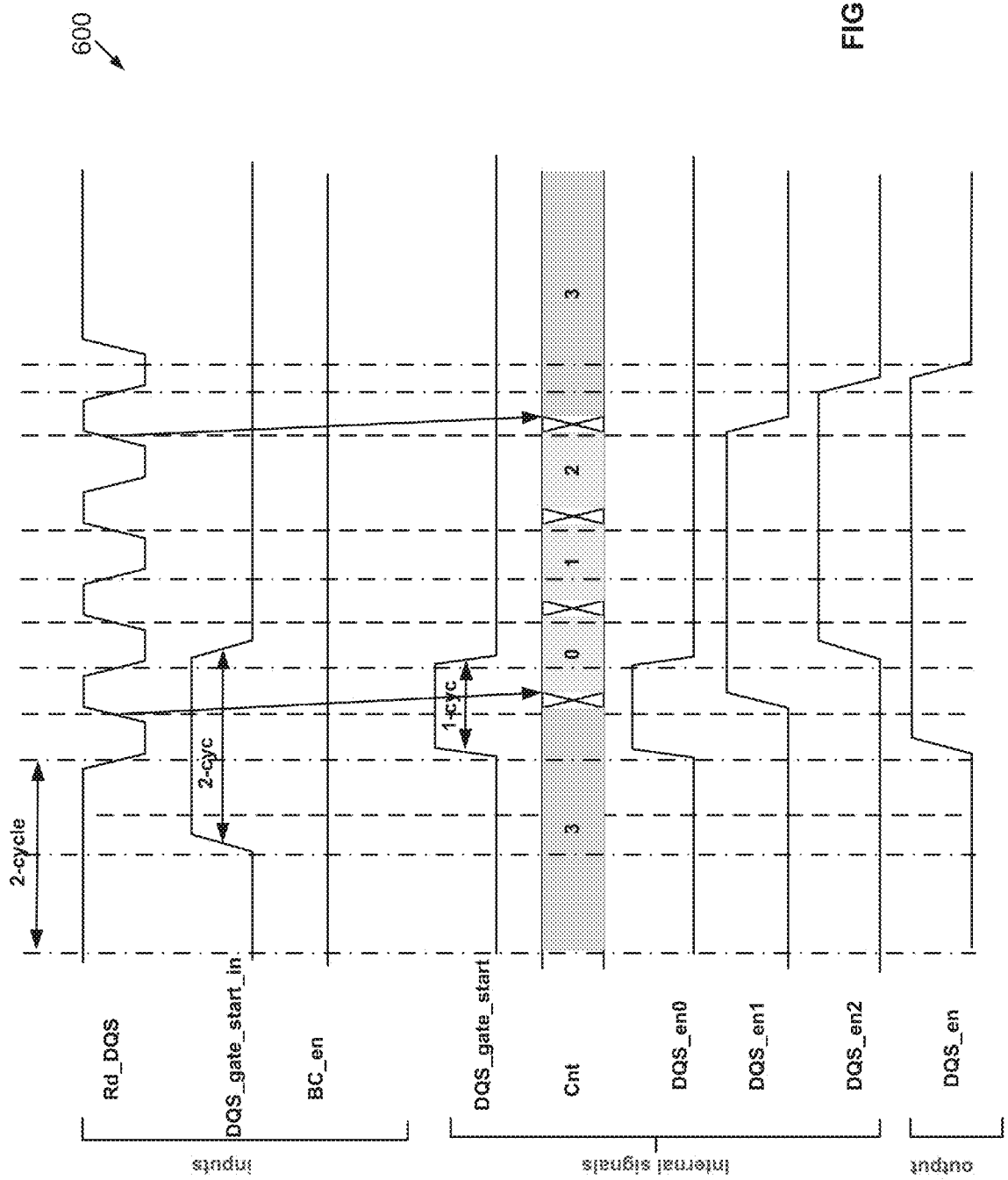
FIG. 6 depicts a signal timing diagram illustrating example DQS gating operations performed using an RD_DQS timing signal with a two-cycle preamble region.

FIG. 6 depicts a signal timing diagram 600 illustrating example DQS gating operations performed using an RD_DQS timing signal with a two-cycle preamble region. As illustrated in FIG. 6, for the two-cycle preamble case, a pulse of the DQS_gate_start_in signal is two cycles in width, where the two-cycle wide DQS_gate_start_in signal corresponds to one read command. The logic of the gating circuit and timing control circuit (e.g., as described above with reference to FIGS. 4A and 4B) is the same for both the oneand two-cycle preamble configurations. Thus, the gating circuit and timing control circuit support a two-cycle preamble configuration and allow the two-cycle preamble window to be fully utilized for adjusting the timing of the DQS_gate_start_in signal. A duration of the pulse of the DQS_gate_start_in signal is configured based on the length of the preamble of the timing signal, such that for a one-cycle preamble, the pulse of the DQS_gate_start_in signal is one cycle in width, and for a two-cycle preamble, the pulse of the DQS_gate_start_in signal is two cycles in width. The different pulse widths for the one- and two-cycle preamble configurations are illustrated in FIGS. 4B and 6, respectively.

Figure 7:
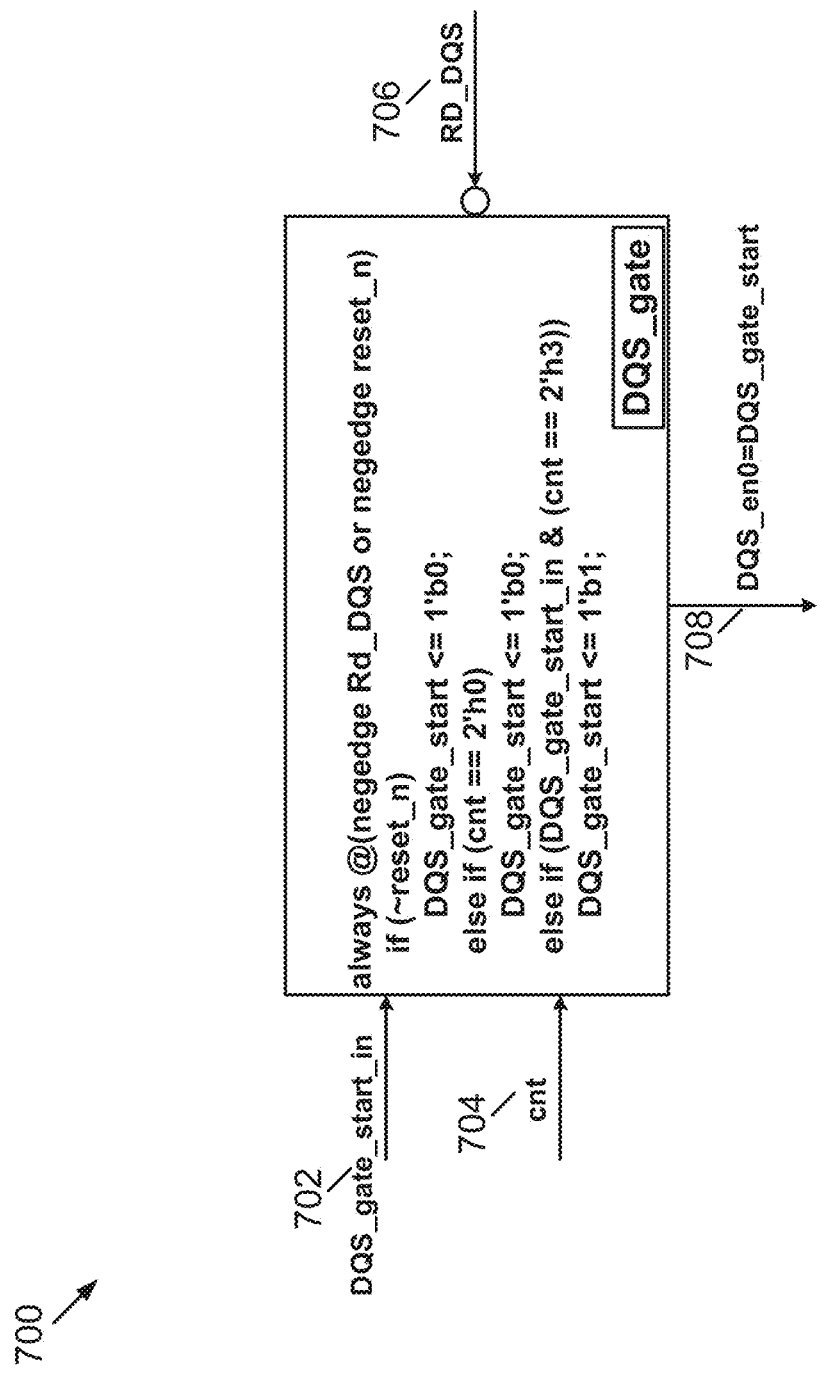
FIG. 7 depicts an example timing control circuit.

FIG. 7 depicts an example timing control circuit 700. An example gating circuit for performing DQS gating control opens a gating window based on a received control signal 708 (e.g., "DQS_gate_start" control signals 402 and 504 in FIGS. 4A and 4B, respectively). Logic employed by the timing control circuit 700 causes a rising edge of the control signal 708 to be located at a logic level low portion of a preamble of a DQS timing signal 706, which in turn allows a gating window to open at a proper point in time within the preamble that is prior to a driving period of the timing signal 706.

To generate the DQS_gate_start control signal 708, the timing control circuit 700 receives a DQS_gate_start_in signal 702, a count ("cnt") signal 704, and the DQS timing signal 706. The DQS_gate_start_in signal 702 includes a pulse that is produced following the issuance of the read command by the memory controller. The pulse, along with the count signal 704 and the timing signal 706 cause the control signal 708 to also include a pulse (e.g., as illustrated by the DQS_gate_start 504 control signal of FIG. 4B), where the pulse of the control signal 708 is delayed in time as compared to the pulse of the DQS_gate_start_in signal 702. The delay causes the pulse of the control signal 708 to be received by the gating circuit at a proper time (e.g., during a preamble portion of a timing signal, such that the gating window opens neither too early nor too late). The logic used in generating the control signal 708 is illustrated in FIG. 7 and explained in detail above with reference to FIGS. 4A and 4B. Using the example timing control circuit 700 of FIG. 7, only a single delay structure (delay cell) is needed per DDR data lane.

Figure 8:
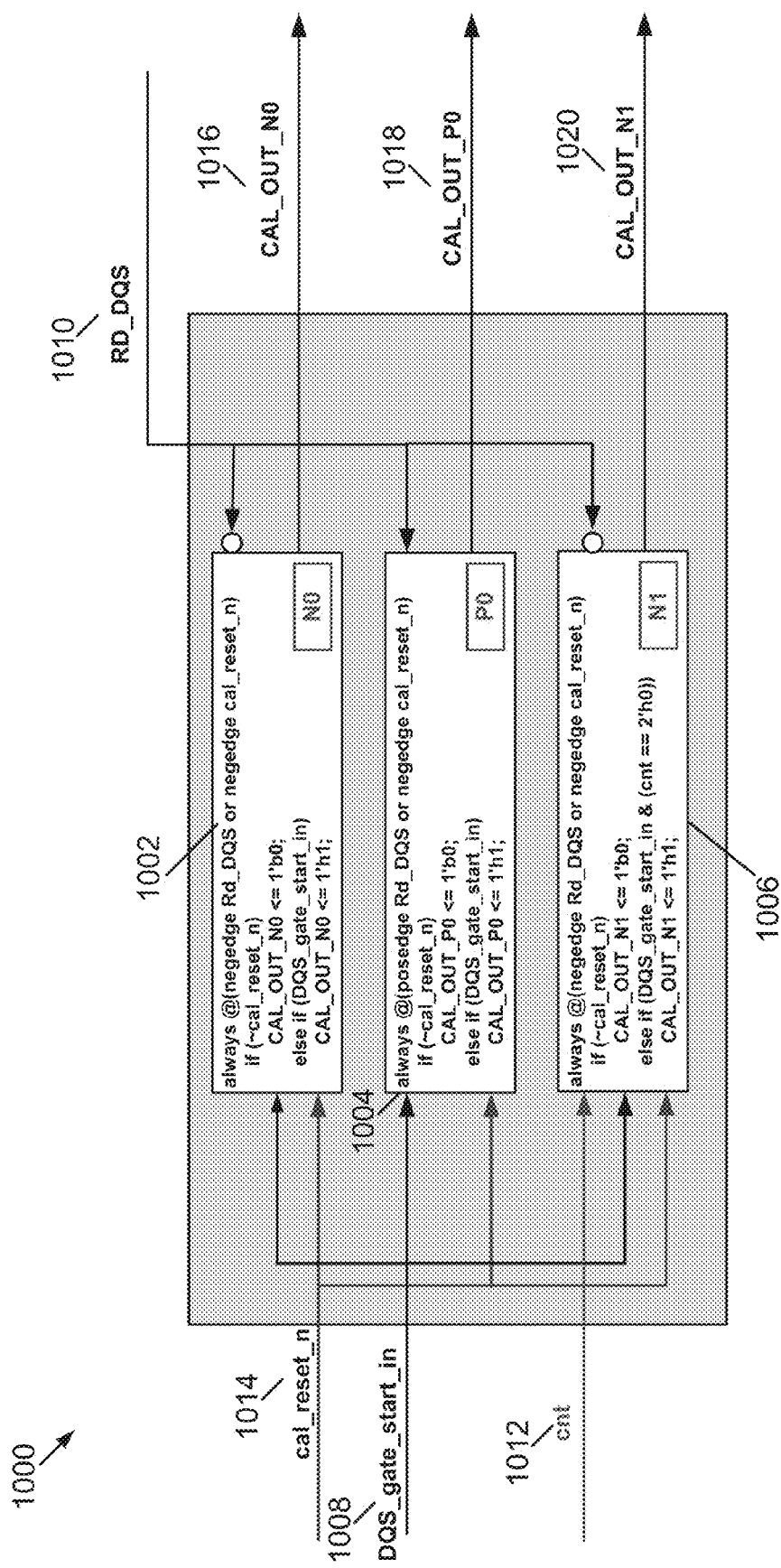
FIG. 8 depicts an example monitor logic circuit used to evaluate a relationship between an RD_DQS timing signal and a DQS_gate_start_in signal.

FIG. 8 depicts an example monitor logic circuit 1000 used to evaluate a relationship between an RD_DQS timing signal 1010 and a DQS_gate_start_in signal 1008. As described in greater detail below, the example monitor logic circuit 1000 is used in a procedure that allows for a DQS gating window to be automatically calibrated. The automatic calibration procedure can be used to address a number of potential DQS gating issues. For example, the DQS_gate_start_in signal 1008 is generated by an on-chip delay structure, and a timing of the DQS_gate_start_in signal 1008 changes when temperature and voltage (i.e., VT) conditions change. As described above, the DQS_gate_start_in signal 1008 is sampled by the RD_DQS timing signal 1010 (e.g., the DQS_gate_start_in signal 1008 is evaluated upon rising or falling edges of the RD_DQS signal 1010) to generate a gating window.

Figure 9A:
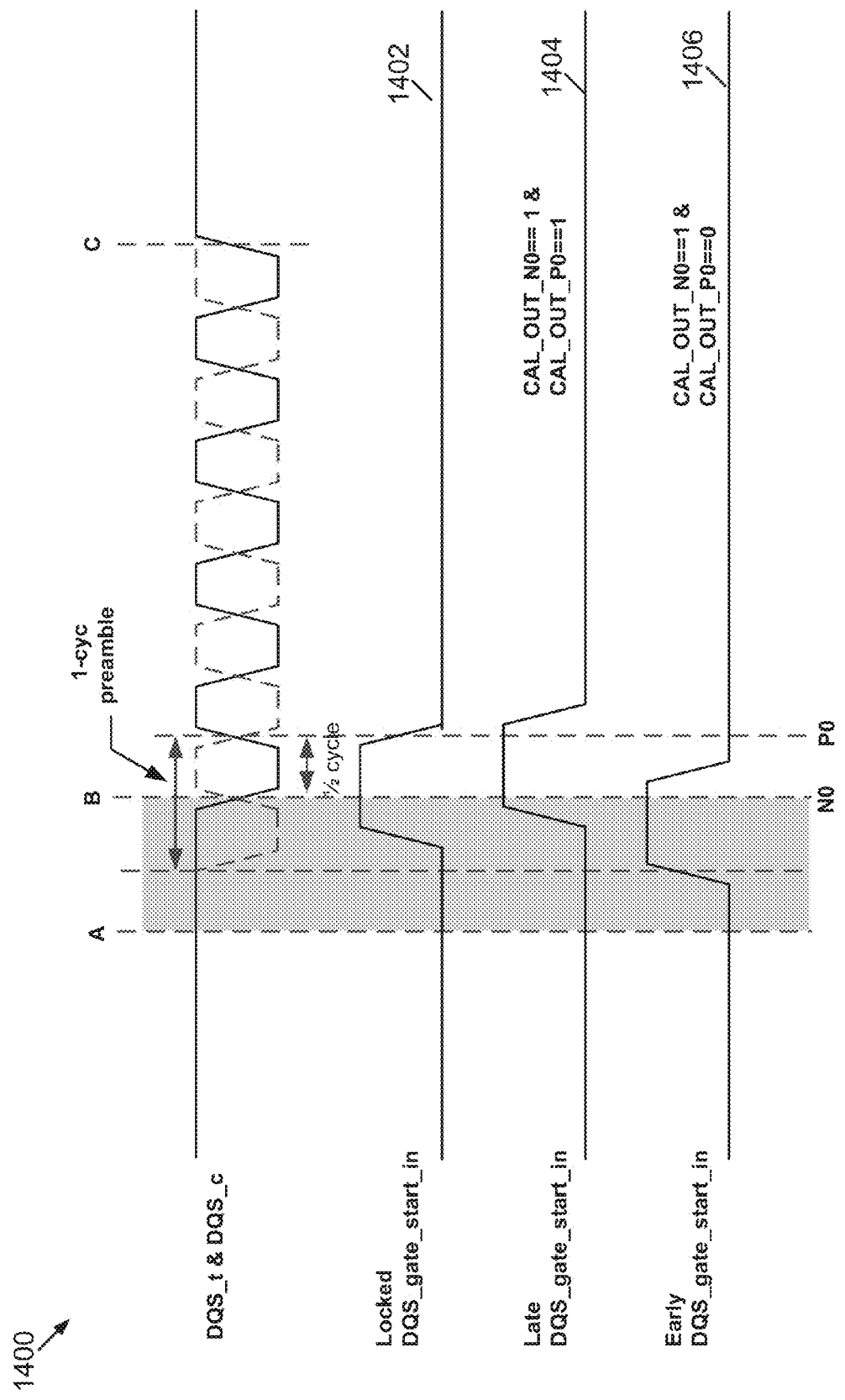
FIGS. 9A and 9B depict signal timing diagrams used to illustrate early and late DQS_gate_start conditions in a runtime auto calibration procedure.
Figure 9B:
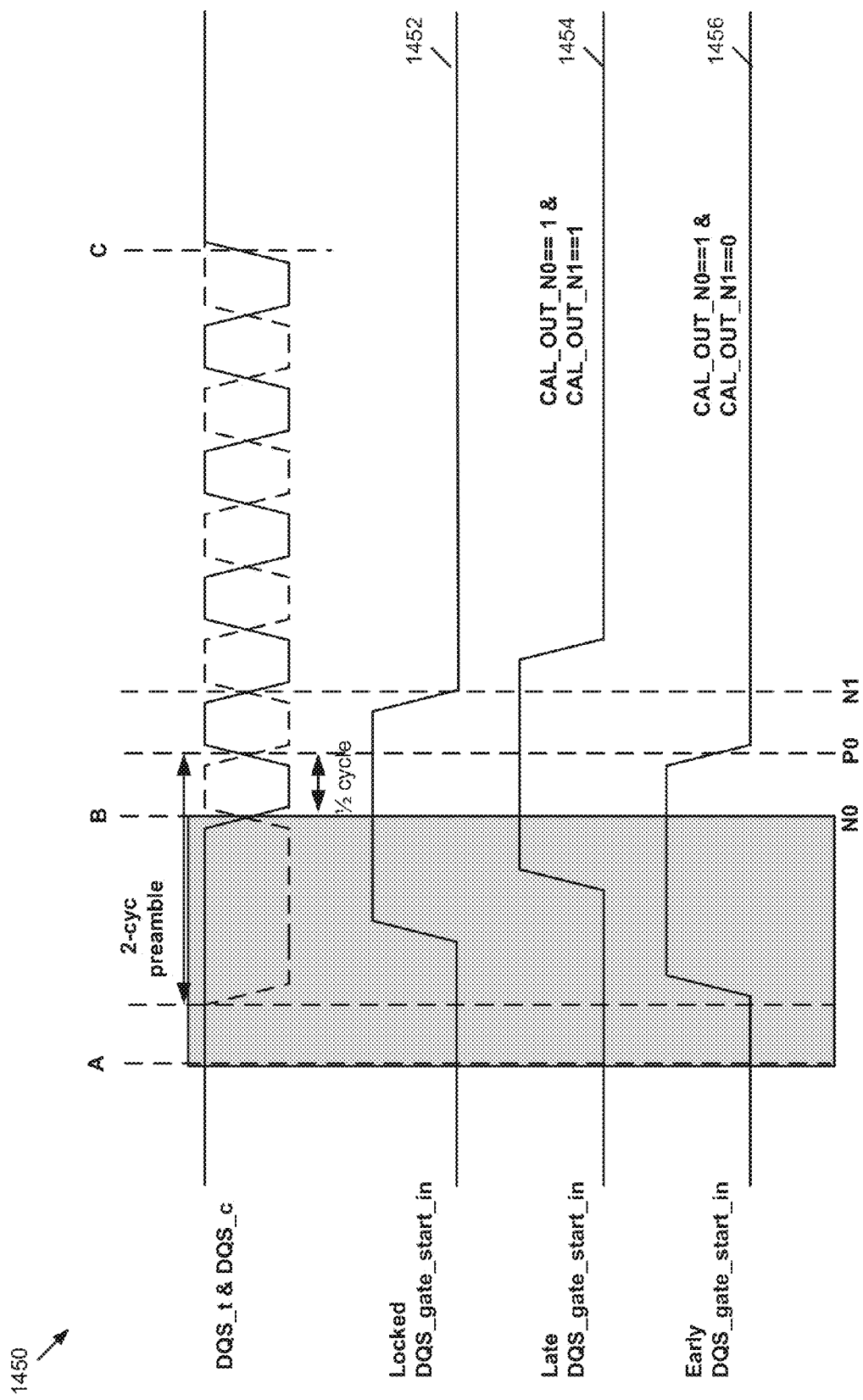

There is a working window for the DQS_gate_start_in signal 1008, and this working window is illustrated in FIGS. 9A and 9B. In FIG. 9A, a timing signal ("DQS_t & DQS_c") has a one-cycle preamble, and the working window for the DQS_gate_start_in signal is between times A and B, as illustrated in the figure. If the rising edge of the DQS_gate_start_in signal is within this working window, the DQS_gate_start_in signal can be sampled correctly by the first falling edge of the preamble of the timing signal at time B. In FIG. 9B, a timing signal ("DQS_t & DQS_c") has a two-cycle preamble and the DQS_gate_start_in pulse has a width of two cycles. As in the example of FIG. 9A, the working window for the DQS_gate_start_in signal in FIG. 9B is between times A and B, where the time B is the time of the falling edge of the preamble of the timing signal. Due to changes in VT conditions, in the examples of FIGS. 9A and 9B, the rising edge of the DQS_gate_start_in signal may be outside of the working windows, which causes failures in DQS gating. Ideally, to prevent such failure, the rising edge of the DQS_gate_start_in signal is located at a center of the working window. As described below, an algorithm is used to adjust the timing of the pulse of the DQS_gate_start_in signal to achieve this purpose.

With reference again to FIG. 8, the circuit 1000 includes monitor logic to evaluate the relationship between the RD_DQS signal 1010 and the DQS_gate_start_in signal 1008. The circuit includes an N0 module 1002, a P0 module 1004, and an N1 module 1006. The modules 1002, 1004, 1006 are implemented using D flip flops that are triggered to rising or falling edges of the RD_DQS signal 1010. The modules 1002, 1004, 1006 each receive the DQS_gate_start_in signal 1008, the RD_DQS signal 1010, and a cal_reset_n signal 1014. Additionally, the N1 module 1006 receives a count ("cnt") signal 1012 (e.g., the count signal 508 of FIG. 4B) from DQS gating logic. In response to the inputs, the N0 module 1002, the P0 module 1004, and N1 module 1006 produce outputs cal_out_N0 1016, cal_out_P0 1018, and cal_out_N1 1020, respectively. The cal_reset_n signal 1014 is a one-cycle low active reset signal used to clear the cal_out outputs 1016, 1018, 1020 for each of the three modules 1002, 1004, 1006.

The N0 module 1002 is driven by a falling edge of the RD_DQS signal 1010 and produces the output cal_out_N0 1016. As illustrated in FIG. 8, logic used within the N0 module 1002 includes the following:

```
always @(negedge RD_DQS or negedge cal_reset_n)
    if (~cal_reset_n)
        cal_out_n0 <= 1'b0;
    else if (DQS_gate_start_in)
        cal_out_n0 <= 1'h1;
```

The logic included in the N0 module 1002 thus evaluates the cal_reset_n signal 1014 and clears the cal_out_N0 signal 1016 if the cal_reset_n signal 1014 is detected to be at a logic level low. If the cal_out_N0 signal 1016 is not cleared based on the cal_reset_n signal 1014, the DQS_gate_start_in signal 1008 is evaluated. If the DQS_gate_start_in signal 1008 is detected to be at a logic level high, the cal_out_N0 signal 1016 is given a value of "1" (i.e., a logic level high).

The P0 module 1004 is driven by a rising edge of the RD_DQS signal 1010 and produces the output cal_out_P0 1018. As illustrated in FIG. 8, logic used within the P0 module 1004 includes the following:

```
always @(posedge RD_DQS or negedge cal_reset_n)
    if (~cal_reset_n)
        cal_out_p0 <= 1'b0;
    else if (DQS_gate_start_in)
        cal_out_p0 <= 1'h1;
```

The logic included in the P0 module 1004 thus evaluates the cal_reset_n signal 1014 and clears the cal_out_P0 signal

1018 if the cal_reset_n signal 1014 is detected to be at a logic level low. If the cal_out_P0 signal 1018 is not cleared based on the cal_reset_n signal 1014, the DQS_gate_start_in signal 1008 is evaluated. If the DQS_gate_start_in signal 1008 is detected to be at a logic level high, the cal_out_P0 signal 1018 is given a value of "1" (i.e., a logic level high).

The N1 module 1006 is driven by a falling edge of the RD_DQS signal 1010 and produces the output cal_out_N1 1020. As illustrated in FIG. 8, logic used within the N1 module 1006 includes the following:

```
always @(negedge RD_DQS or negedge cal_reset_n)
    if (~cal_reset_n)
        cal_out_n1 <= 1'b0;
    else if (DQS_gate_start_in & (cnt == 2'h0))
        cal_out_n1 <= 1'h1;
```

The logic included in the N1 module 1006 thus evaluates the cal_reset_n signal 1014 and clears the cal_out_N1 signal 1020 if the cal_reset_n signal 1014 is detected to be at a logic level low. If the cal_out_N1 signal 1020 is not cleared based on the cal_reset_n signal 1014, the DQS_gate_start_in signal 1008 and the count signal 1012 are evaluated. If the DQS_gate_start_in signal 1008 is detected to be at a logic level high and the count signal 1012 has a value of "0," the cal_out_N1 signal 1020 is given a value of "1" (i.e., a logic level high).

The outputs cal_out_N0 1016, cal_out_P0 1018, and cal_out_N1 1020 of the circuit 1000 are used in a two-phase calibration procedure. An initial calibration is performed manually by software. A purpose of the initial calibration is to determine initial delay settings for the DQS_gate_start_in signal 1008, including half-cycle-based delay settings and delay line settings that cause the rising edge of the DQS_gate_start_in signal 1008 to be located at the center of the working window of the RD_DQS signal 1010, as described above (e.g., the working window between times A and B, as illustrated in FIGS. 9A and 9B). The initial calibration is used to compensate for a number of process and board variations. The two-phase calibration procedure also includes a runtime auto calibration. After the initial calibration, the runtime auto calibration controller slowly adjusts the delay line settings to compensate for voltage and temperature (VT) changes based on a calibration window and algorithm settings discussed in further detail below.

Figure 10:
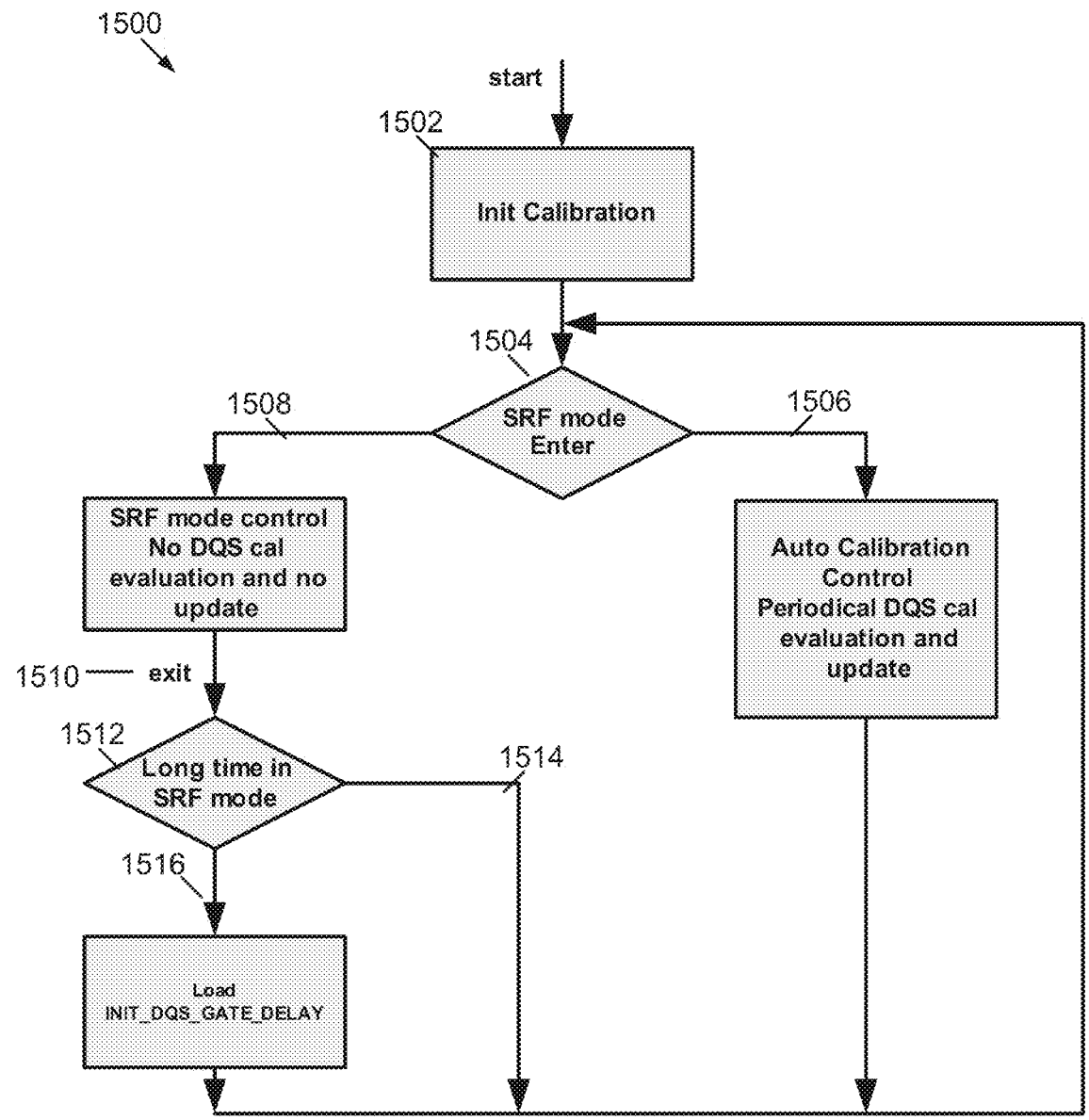
FIG. 10 is a flowchart depicting an example method for auto calibration of a DDR DQS gating window.

FIG. 10 is a flowchart 1500 depicting an example method for auto calibration of a DDR DQS gating window. At 1502, the calibration procedure is started with an initial calibration, where the purpose of the initial calibration is to determine an initial set of delay settings to cause a rising edge of a DQS_gate_start_in pulse to be located in the center of a working window of the preamble of a DQS timing signal. At 1504, after performing the initial calibration, a self refresh (SRF) mode is entered, where the SRF mode is a low power mode. In the SRF mode, auto calibration control can be performed on a periodic basis, or alternatively, the calibration is stopped in the SRF mode. If path 1506 is taken in FIG. 10, in the SRF mode, auto calibration control is performed on a periodic basis, such that periodically, a DQS calibration evaluation and update are performed. The evaluation and update performed includes an evaluation phase and an analysis phase, as described below with respect to FIG. 13. If path 1508 is taken, calibration is stopped, and no DQS calibration evaluations are performed, and no updates are performed. At 1510, the SRF mode is exited. When exiting the SRF mode, a determination is made as to whether the delay setting is to be unchanged, or whether the delay setting is reset to the initial setting. In making the determination, a second determination at 1512 is made, where the second determination evaluates whether the SRF mode has been enabled for an extended (i.e., long) amount of time. If path 1514 is taken, the delay setting is unchanged, and if path 1516 is taken, the initial delay setting, "INIT_DQS_GATE_DELAY," is loaded.

Figure 11:
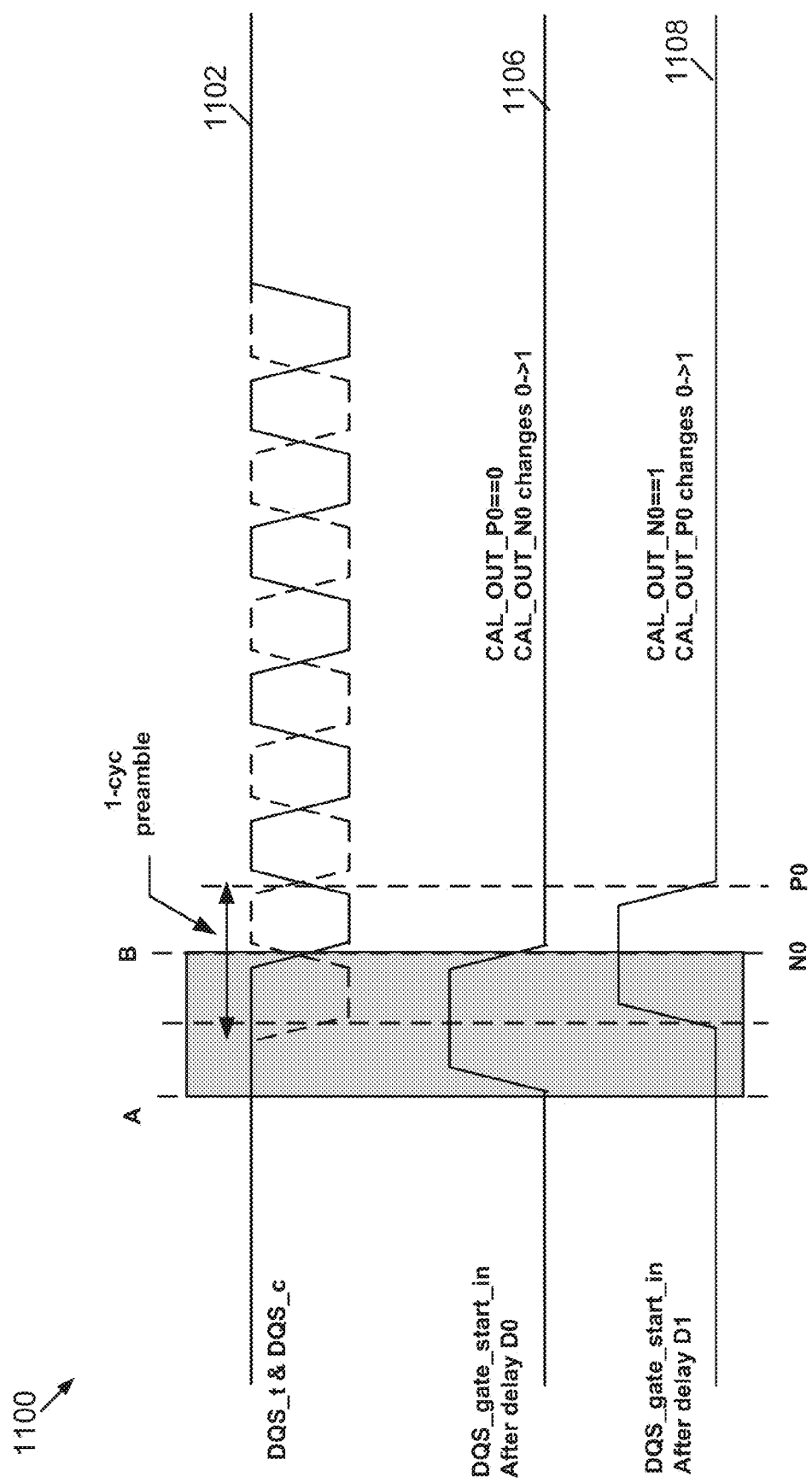
FIG. 11 depicts a signal timing diagram used to illustrate aspects of an initial calibration for a one-cycle preamble case.

FIG. 11 depicts a signal timing diagram 1100 used to illustrate aspects of an initial calibration for a one-cycle preamble case. In FIG. 11, an RD_DQS signal having the one-cycle preamble region is depicted at 1102. As described above, in an ideal case, a rising edge of a DQS_gate_start_in pulse is temporally aligned with a center of a working window that is defined by start and end times A and B, respectively. To achieve the ideal case, logic employed by the initial calibration includes an outer and an inner loop. In determining the appropriate delay setting for the DQS_gate_start_in signal, the outer loop is used to modify the delay setting by half-cycle steps, and the inner loop is used to modify the delay setting by delay line steps. The outer loop starts from DDR read latency (e.g., CAS latency in addition to additive latency). In the inner loop, delay line steps are incremented and one read command is issued per delay line step.

During the inner loop, starting from a delay line step of "0," the delay line step is increased by one until a CAL_OUT_N0 output of a monitor logic circuit (e.g., the CAL_OUT_N0 signal 1016 of the circuit 1000 of FIG. 8) is equal to "1." When the CAL_OUT_N0 output is equal to "1," a delay setting D0 is determined. If a max delay line step is reached and the CAL_OUT_N0 output is not equal to "1," the inner loop is exited. The determination of the delay setting D0 is illustrated at 1106. In determining the delay setting D0, the CAL_OUT_N0 output transitions from "0" to "1" when the DQS_gate_start_in signal is detected to be at a logic level high during the first falling edge of the RD_DQS signal, as illustrated at 1106.

Continuing in the inner loop, the delay line step is increased further until a CAL_OUT_P0 output of the monitor logic circuit is equal to "1." When the CAL_OUT_P0 output is equal to "1," a delay setting D1 is determined. If a max delay line step is reached and the CAL_OUT_P0 output is not equal to "1," the inner loop is exited. The determination of the delay setting D1 is illustrated at 1108. In determining the delay setting D1, the CAL_OUT_P0 output transitions from "0" to "1" when the DQS_gate_start_in is detected to be at a logic level high during a first rising edge of the RD_DQS signal, as illustrated at 1108. The delay setting D1 is the initial setting for DQS gating of a particular data lane and is stored as a variable, "init_dqs_gate_delay," within a memory. The delay setting D1 causes the rising edge of the DQS_gate_start_in signal to be in the center of the working window defined between times A and B of the timing signal preamble region. The delay setting D1 is larger than the delay setting D0, in terms of delay steps.

Figure 12:
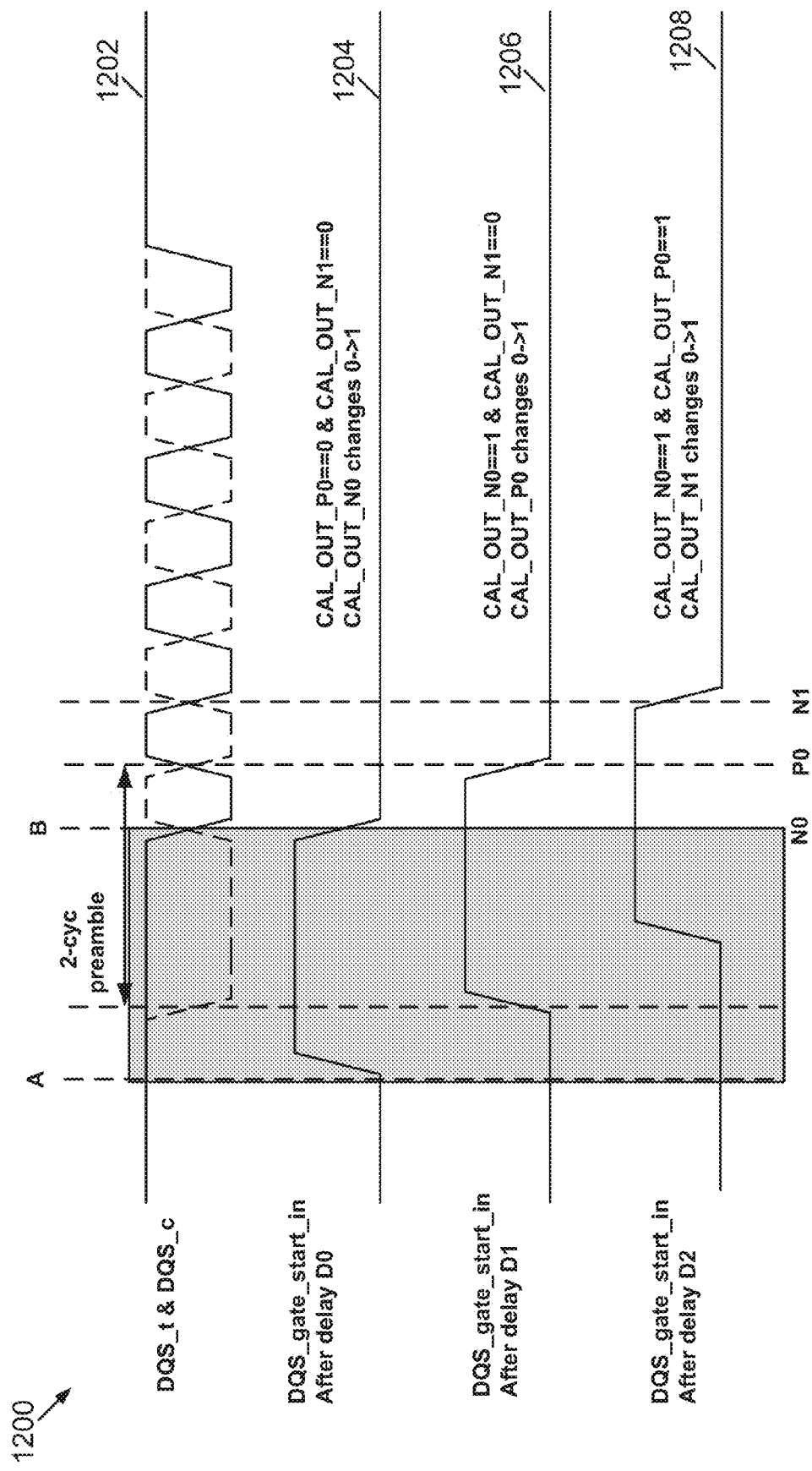
FIG. 12 depicts a signal timing diagram used to illustrate aspects of an initial calibration for a two-cycle preamble case.

FIG. 12 depicts a signal timing diagram 1200 used to illustrate aspects of an initial calibration for a two-cycle preamble case. In FIG. 12, an RD_DQS signal having the two-cycle preamble region is depicted at 1202. As described above, in an ideal case, a rising edge of a DQS_gate_start_in pulse is temporally aligned with a center of a working window of the RD_DQS signal, where the working window is defined by start and end times A and B, respectively. To achieve the ideal case, logic employed by the initial calibration includes an outer and an inner loop, similar to that described above for FIG. 11. In determining the appropriate delay setting for the DQS_gate_start_in signal, the outer loop is used to modify the delay setting by half-cycle steps, and the inner loop is used to modify the delay setting by delay line steps. The outer loop starts from a DDR read latency (e.g., CAS latency in addition to additive latency). In the inner loop, delay line steps are incremented and one read command is issued per delay line step.

During the inner loop, starting from a delay line step of "0," the delay line step is increased by one until a CAL_OUT_N0 output of a monitor logic circuit is equal to "1." When the CAL_OUT_N0 output is equal to "1," a delay setting D0 is determined. If a max delay line step is reached and the CAL_OUT_N0 output is not equal to "1," the inner loop is exited. The determination of the delay setting D0 is illustrated at 1204. In determining the delay setting D0, the CAL_OUT_N0 output transitions from "0" to "1" when the DQS_gate_start_in is detected to be at a logic level high during the first falling edge of the RD_DQS signal, as illustrated at 1204.

Continuing in the inner loop, the delay line step is increased further until a CAL_OUT_P0 output of the monitor logic circuit is equal to "1." When the CAL_OUT_P0 output is equal to "1," a delay setting D1 is determined. If the max delay line step is reached and the CAL_OUT_P0 output is not equal to "1," the inner loop is exited. The determination of the delay setting D1 is illustrated at 1206. In determining the delay setting D1, the CAL_OUT_P0 output transitions from "0" to "1" when the DQS_gate_start_in signal is detected to be at a logic level high during a first rising edge of the RD_DQS signal, as illustrated at 1206.

Continuing in the inner loop, the delay line step is increased further until a CAL_OUT_N1 output of the monitor logic circuit is equal to "1." When the CAL_OUT_N1 output is equal to "1," a delay setting D2 is determined. If the max delay line step is reached and the CAL_OUT_N output is not equal to "1," the inner loop is exited. The determination of the delay setting D2 is illustrated at 1208. In determining the delay setting D2, the CAL_OUT_N1 output is set equal to "1" when the DQS_gate_start_in is detected to be at a logic level high and a counter value is equal to "2" during a second falling edge of the RD_DQS signal, as illustrated at 1208. The delay setting D2 is the initial setting for DQS gating of a particular data lane and is stored as a variable, "init_dqs_gate_delay," within a memory. The delay setting D2 causes the rising edge of the DQS_gate_start_in signal to be in the center of the working window defined by times A and B of the timing signal preamble region. The delay setting D2 is larger than the delay setting D1, in terms of delay steps. Additionally, the delay setting D1 is larger than the delay setting D0, in terms of delay steps.

Figure 13:
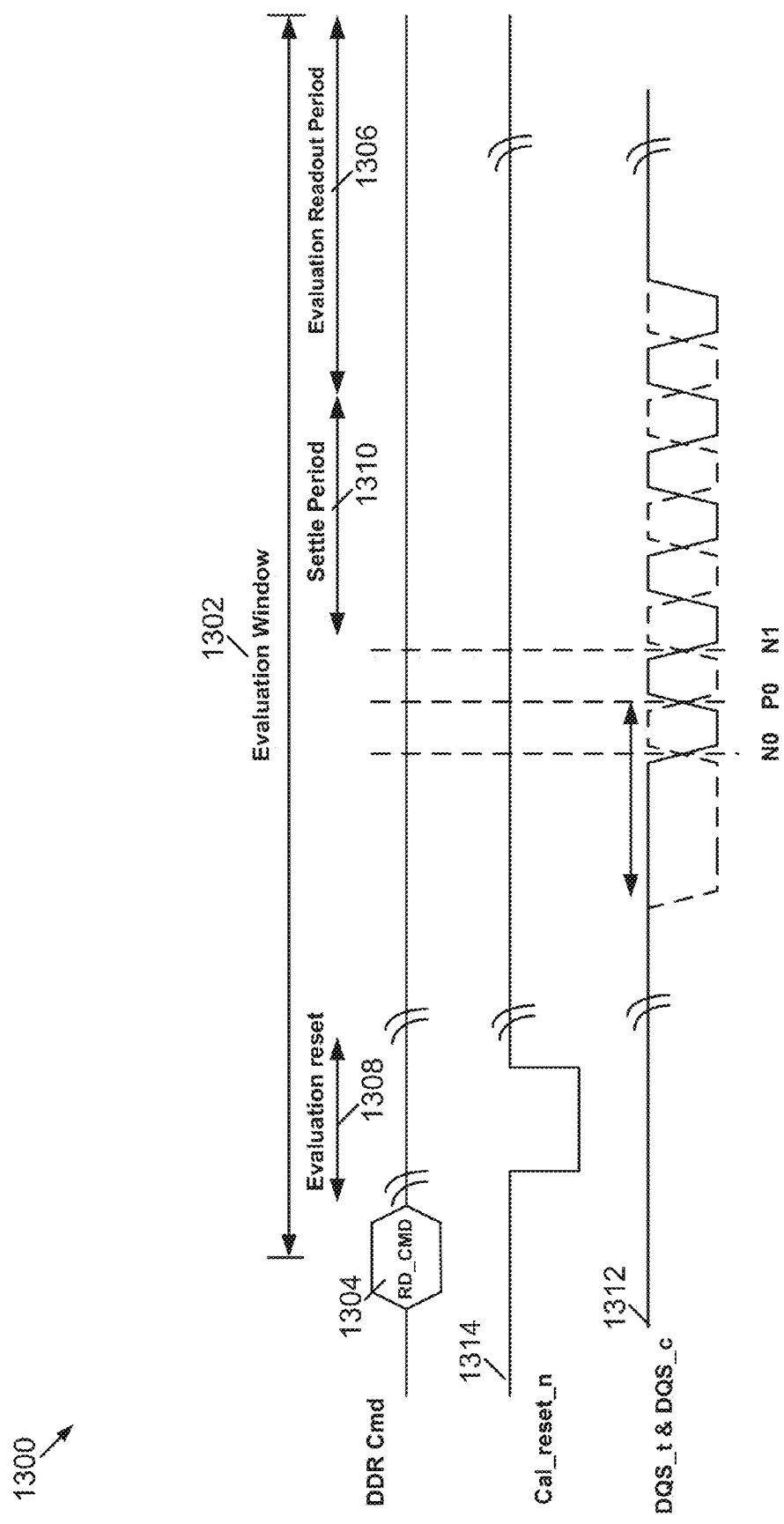
FIG. 13 depicts a signal timing diagram used to illustrate aspects of an evaluation procedure for a runtime auto calibration procedure.

FIG. 13 depicts a signal timing diagram 1300 used to illustrate aspects of an evaluation procedure for a runtime auto calibration procedure. In FIG. 13, an evaluation window 1302 is defined for one calibration evaluation procedure. The evaluation procedure starts from a read command 1304 and ends after an evaluation readout period 1306. Following the start of the evaluation procedure using the DDR read command 1304, an evaluation reset 1308 is performed by setting a Cal_reset_n signal 1314 to a logic level low. The logic level low of the Cal_reset_n signal 1314 is a one-cycle, logic level low reset. In an evaluation period, samples are taken at P0, N0, and N1 clock edges of an RD_DQS timing signal 1312 after the evaluation reset 1308. The P0 clock edge is a first rising edge of the RD_DQS signal 1312, the N0 clock edge is a first falling edge of the RD_DQS signal 1312, and the N1 clock edge is a second falling edge of the RD_DQS signal 1312. Following the evaluation period, a settle period 1310 occurs, where the settle period allows flip-flops used in the evaluation (e.g., D flip-flops used to implement the P0 module 1004, N0 module 1002, and N1 module 1006 of circuit 1000 of FIG. 10) to settle to a possible meta-stable state. The evaluation procedure ends with the evaluation readout period 1306, where CAL_OUT outputs (e.g., CAL_OUT_N0 1016, CAL_OUT_P0 1018, and CAL_OUT_N1 1020 produced by the N0 module 1002, the P0 module 1004, and the N1 module 1006, respectively, of FIG. 10) are read back for calibration, thus concluding one evaluation procedure.

With reference again to FIGS. 9A and 9B, these figures depict signal timing diagrams 1400, 1450 used to illustrate early and late DQS_gate_start_in conditions in a runtime auto calibration procedure. The signal timing diagrams 1400, 1450 show the early and late conditions for DQS_gate_start_in for a one-cycle preamble case and a two-cycle preamble case, respectively. Signals 1402 and 1452 depict DQS_gate_start_in signals with pulses positioned at near ideal points in time (e.g., rising edges of the DQS_gate_start_in signals located near a center of the working window located between times A and B). Signals 1406 and 1456 depict DQS_gate_start_in signals with pulses that are too early in time. At 1406, for the one-cycle preamble case with the early DQS_gate_start_in pulse, a CAL_OUT_N0 output is equal to "1," and a CAL_OUT_P0 output is equal to "0." At 1456, for the two-cycle preamble case with the early DQS_gate_start_in pulse, a CAL_OUT_N1 output is equal to "0," and a CAL_OUT_N0 output is equal to "1." Similarly, signals 1404 and 1454 depict DQS_gate_start_in signals with pulses that are too late in time. At 1404, for the one-cycle preamble case with the late DQS_gate_start_in pulse, a CAL_OUT_N0 output is equal to "1," and a CAL_OUT_P0 output is equal to "1." At 1454, for the two-cycle preamble case with the late DQS_gate_start_in pulse, a CAL_OUT_N1 output is equal to "1," and a CAL_OUT_N0 output is equal to "1." Changes in the calibration outputs that occur when pulses of the DQS_gate_start_in signal are too early or too late are detected and used to adjust delay line settings to compensate for voltage and temperature changes, among others.

In performing the runtime auto calibration procedure, a calibration window timer CAL_WIN_TIMER is used. When the calibration window timer is enabled, the calibration window timer starts counting, and when the calibration window timer reaches a programmed CAL_WIN_PERIOD value, the calibration window timer is cleared. After being cleared, the calibration window timer starts a next round of counting. A DDR refresh cycle can be used in setting the CAL_WIN_PERIOD (e.g., the CAL_WIN_PERIOD is set to M times the DDR refresh cycle, where M is an integer). The runtime auto calibration procedure also uses an evaluation procedure count variable EVAL_CNT, which is used to hold a count of the evaluation procedure to be performed in the calibration window.

For the runtime auto calibration procedure, when a procedure or variable AUTO_DQS_CAL is enabled, the CAL_WIN_TIMER starts counting. When the timer reaches the programmed CAL_WIN_PERIOD value, one CAL_WIN_PERIOD ends, and the CAL_WIN_TIMER goes back to zero. After being reset, the CAL_WIN_TIMER continues counting, and a new CAL_WIN_PERIOD starts. There are two phases of operation in a single CAL_WIN_PERIOD, an evaluation phase and an analysis phase. In the evaluation phase, after a calibration window starts, a) the evaluation is performed (e.g., the evaluation described above with reference to FIG. 13), b) the evaluation counter increases by 1, and c) the evaluation results are recorded. Steps a) through c) are repeated until the evaluation_counter reaches the evaluation procedure count variable EVAL_CNT. At this point, the evaluation phase is complete, and the analysis phase begins. In the analysis phase, all recorded values of the CAL_OUT output (i.e., CAL_OUT_N0, CAL_OUT_P0, and CAL_OUT_N) are analyzed, new delay settings are calculated, and an update of the delay settings is scheduled. Specifically, in the analysis phase, if a late DQS_gate_start_in is detected, delay line steps are decreased by a DELTA variable for a next update. If an early DQS_gate_start_in is detected, delay line steps are increased by the DELTA variable for the next update. The DELTA variable is a programmable variable. To conclude the analysis phase, the next DQS gating delay update is scheduled during a DDR non-read operation.

As described above, the evaluation phase includes steps that include a performance of an evaluation, an incrementing of the evaluation_counter, and a recording of the evaluation results. Specifically, the evaluation performed includes steps performed in the evaluation procedure described above with reference to FIG. 13. Thus, in one calibration window, the evaluation procedure described above with reference to FIG. 13 or a similar evaluation procedure is performed a number of times equal to the evaluation procedure count variable EVAL_CNT. For each of the EVAL_CNT evaluation procedures performed, CAL_OUT output values are recorded.

For the one-cycle preamble case, CAL_OUT[1:0] values {CAL_OUT_P0, CAL_OUT_N0} are recorded. For the two-cycle preamble case, CAL_OUT[1:0] values (CAL_OUT_N, CAL_OUT_N0) are recorded. The CAL_OUT values to be recorded are depicted at FIGS. 9A and 9B for the one-cycle and two-cycle preamble cases, respectively. For the one-cycle preamble case, if all CAL_OUT[1:0] values recorded in the current CAL_WIN_PERIOD are 2'b11, the DQS_gate_start_in is too late, and if all CAL_OUT[1:0] recorded in the current CAL_WIN_PERIOD are 2'b01, the DQS_gate_start_in signal is too early. For the two-cycle preamble case, if all CAL_OUT[1:0] values recorded in the current CAL_WIN_PERIOD are 2'b11, the DQS_gate_start_in signal is too late, and if all CAL_OUT[1:0] recorded in the current CAL_WIN_PERIOD are 2'b01, the DQS_gate_start_in is too early.

Calibration is performed per DDR rank basis. If in one CAL_WIN_PERIOD a sufficient number of evaluation procedures are performed, the CAL_OUT recording starts over for a next CAL_WIN_PERIOD. If in one CAL_WIN_PERIOD an insufficient number of evaluation procedures are performed, the CAL_OUT recording cycle is extended to a next CAL_WIN_PERIOD. If in N consecutive CAL_WIN_PERIODs there are still not enough evaluations accumulated, DQS_auto_cal control logic raises a flag to the memory controller to schedule dummy reads for a DQS calibration purpose.

Figure 14:
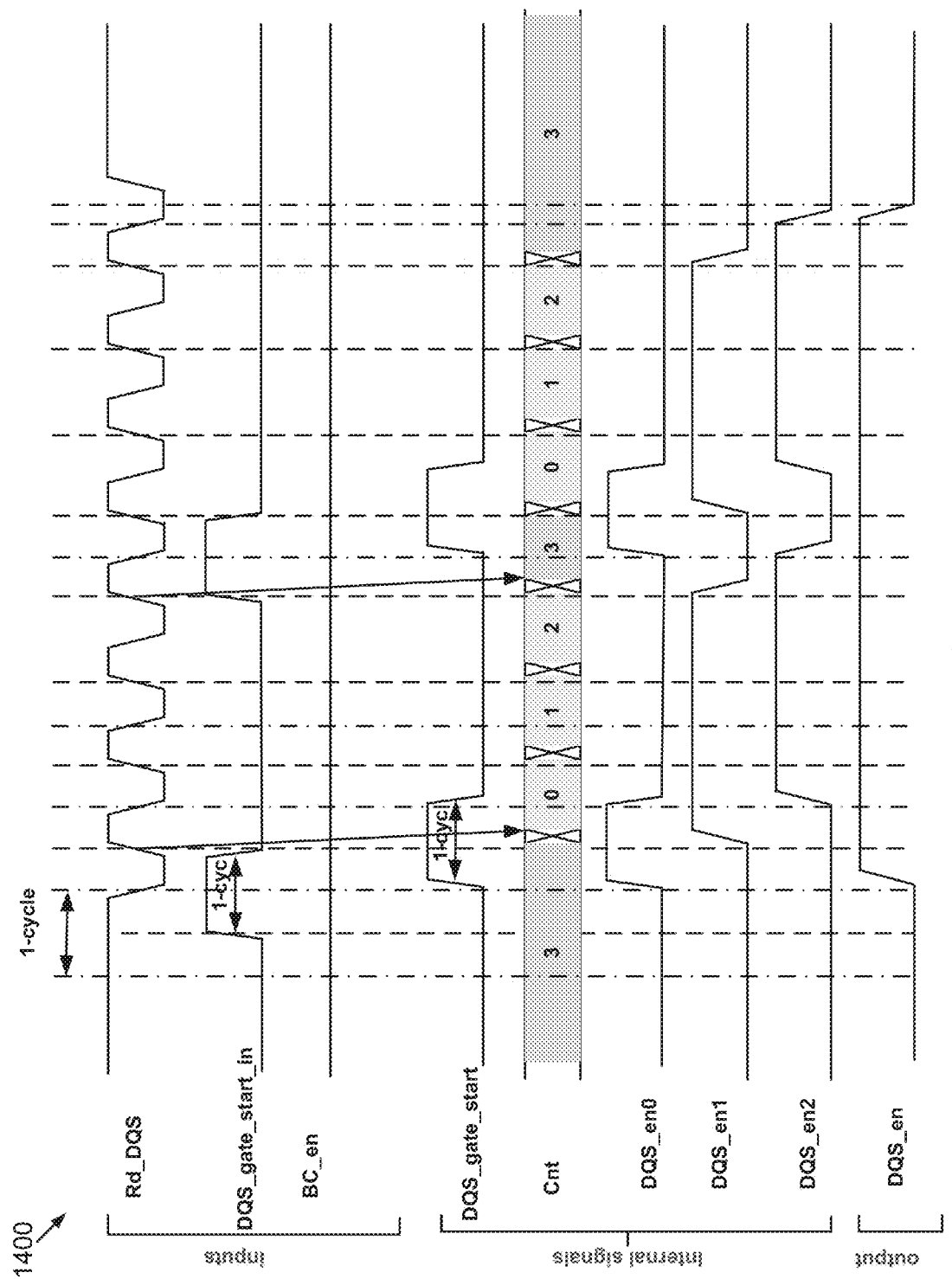
FIG. 14 depicts a signal timing diagram illustrating example DQS gating operations performed in response to back-to-back read commands issued from a memory controller.

FIG. 14 depicts a signal timing diagram 1400 illustrating example DQS gating operations performed in response to back-to-back read commands issued from a memory controller. In FIG. 14, the DQS gating operation is performed by a gating circuit (e.g., the gating circuit of FIG. 4A). In the signal timing diagram 1400, an Rd_DQS timing signal seen at the gate of a SOC or memory controller includes a one-cycle preamble region. A DQS_gate_start_in control signal includes pulses that correspond to the back-to-back read commands and that are one-cycle in duration to match the duration of the preamble region. The signal timing diagram 1400 illustrates use of a count signal (Cnt), first intermediate signal (DQS_en1), and second intermediate signal (DQS_en2) to generate a gating window (DQS_en) to gate the Rd_DQS timing signal at the SOC or memory controller. The count, first intermediate, second intermediate, and gating window signals are similar those described above with reference to FIG. 4B.

Figure 15:
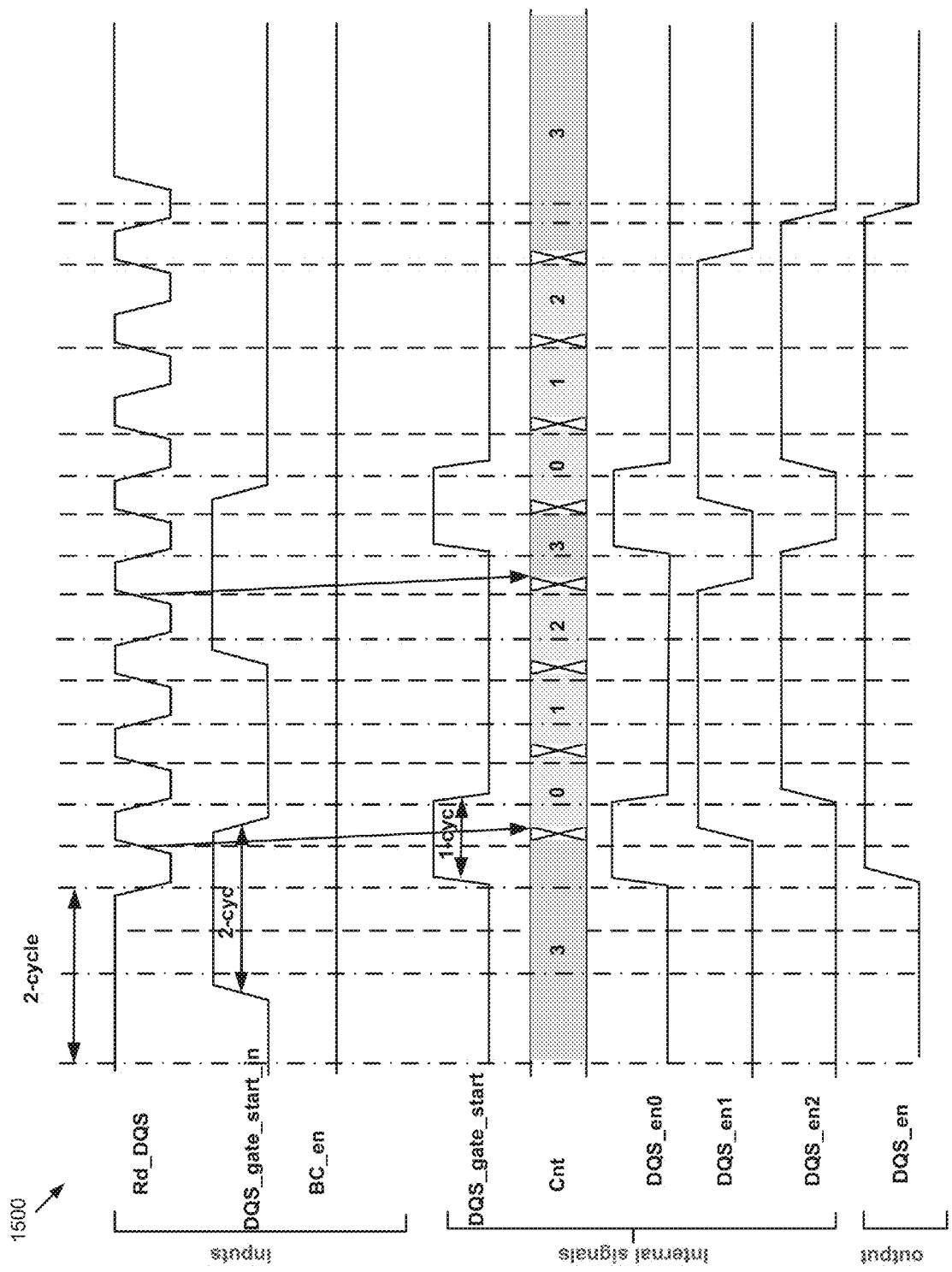
FIG. 15 depicts a signal timing diagram illustrating example DQS gating operations performed in response to back-to-back read commands issued from a memory controller, where a preamble region of an Rd_DQS timing signal has a duration of two cycles.

FIG. 15 depicts a signal timing diagram 1500 illustrating example DQS gating operations performed in response to back-to-back read commands issued from a memory controller, where a preamble region of an Rd_DQS timing signal has a duration of two cycles. A DQS_gate_start_in control signal includes pulses that correspond to the back-to-back read commands and that are two cycles in duration to match the duration of the preamble region. In FIG. 15, to handle the back-to-back read commands and allow all portions of a data transfer region of the Rd_DQS timing signal to be read by a SOC or memory controller, logic employed by a gating circuit performing the gating operations causes a DQS_en gating window to stay at a logic level high at all relevant times.

Figure 16:
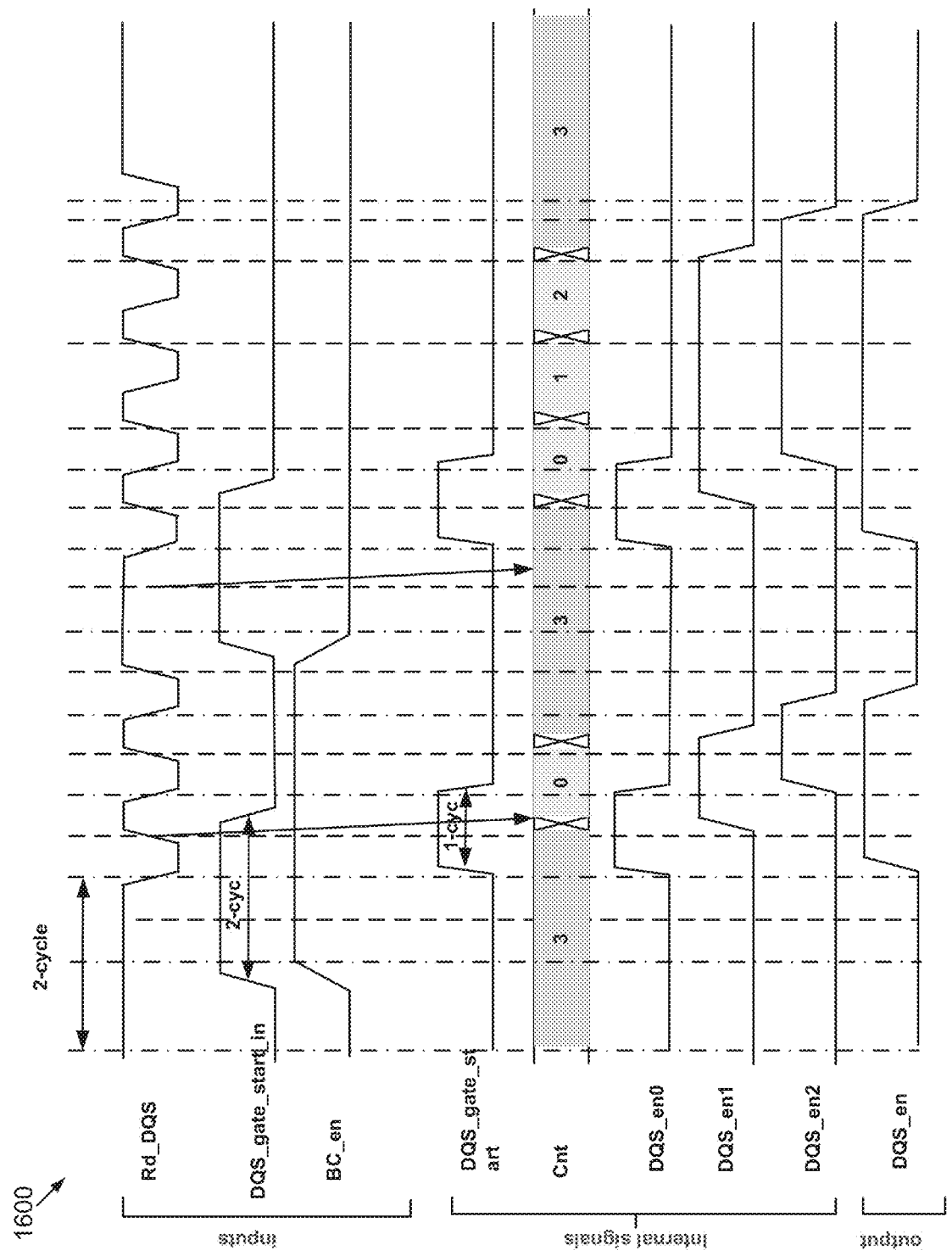
FIG. 16 depicts a signal timing diagram illustrating an example DQS gating operation performed in response to a burst chop command.

FIG. 16 depicts a signal timing diagram 1600 illustrating an example DQS gating operation performed in response to a burst chop command. DDR3 and DDR4 include functionality for an on-the-fly, BC4 (burst chopping) mode. In FIG. 16, a BC_EN signal is generated to indicate that the read command is a BC4 command. The BC_EN signal is four cycles in duration. Following the burst chop command, a normal read command is issued and processed, as illustrated in the figure. Thus, FIG. 16 illustrates example DQS gating operations performed in response to back-to-back read commands issued from a memory controller, where the first read command is a burst chop command and the second read command is a normal read command, and where a preamble region of an Rd_DQS timing signal has a duration of two cycles.

Figure 17:
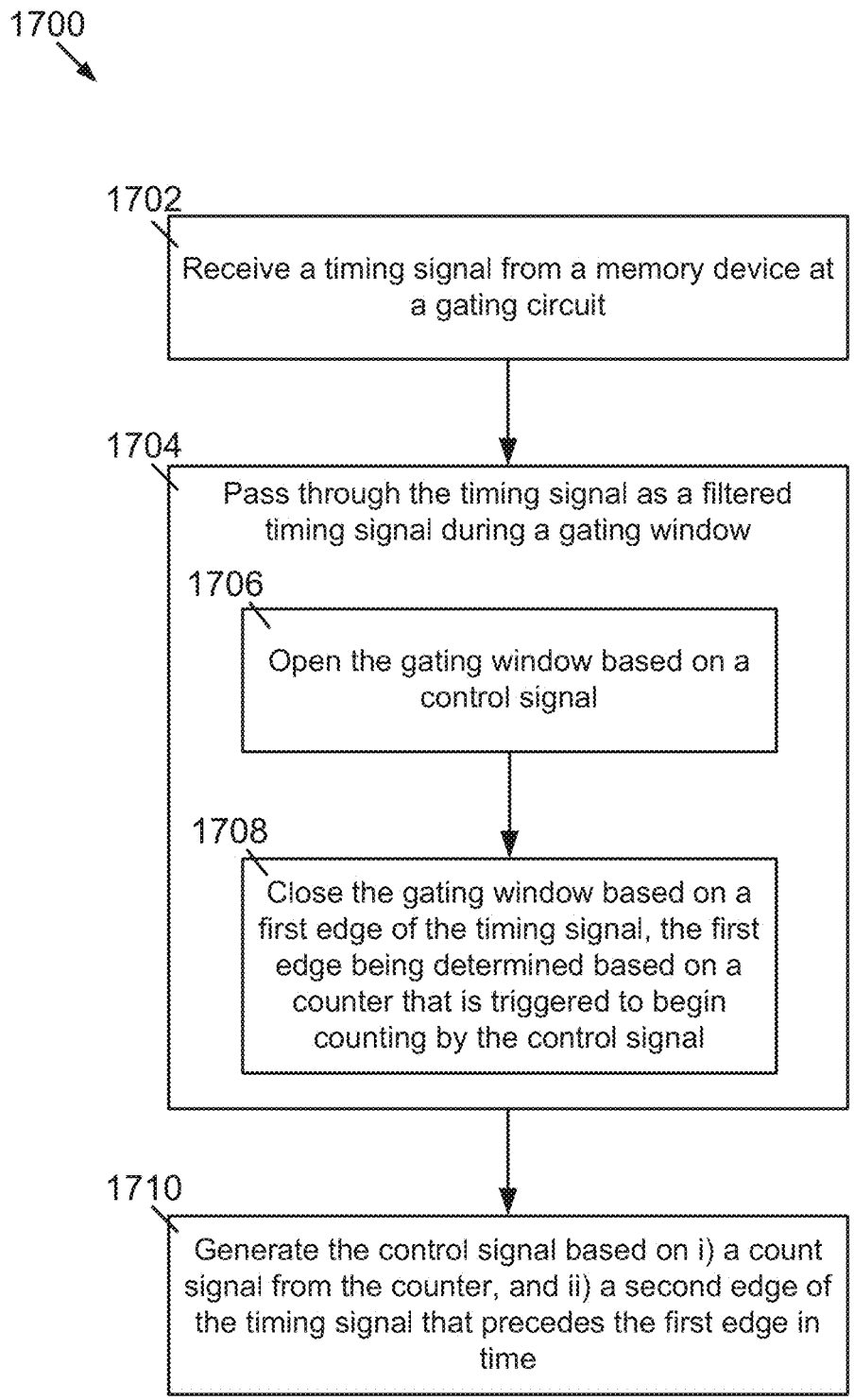
FIG. 17 is a flowchart illustrating an example method for timing read operations with a memory device.

FIG. 17 is a flowchart 1700 illustrating an example method for timing read operations with a memory device. At 1702, a timing signal from the memory device is received at a gating circuit. At 1704, the timing signal is passed through as a filtered timing signal during a gating window. At 1706, the gating circuit is configured to open the gating window based on a control signal. At 1708, the gating circuit is further configured to close the gating window based on a first edge of the timing signal. The first edge is determined based on a counter that is triggered to begin counting by the control signal. At 1710, the control signal is generated based on i) a read request from a memory controller, and ii) a second edge of the timing signal that precedes the first edge in time.

This written description uses examples to disclose the invention, including the best mode, and also to enable a person skilled in the art to make and use the invention. The patentable scope of the invention may include other examples. Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A system for timing read operations with a memory device, the system comprising:
   a gating circuit configured to receive a timing signal from the memory device and to pass through the timing signal as a filtered timing signal during a gating window, the gating circuit being configured to:
   open the gating window based on a control signal, and
   close the gating window based on a first edge of the timing signal, the first edge being determined based on a counter that is triggered to begin counting by the control signal, wherein the gating window is closed automatically based on an incrementing of the counter and without regard to the control signal;
   a timing control circuit configured to generate the control signal based on i) a count signal from the counter, and ii) a second edge of the timing signal that precedes the first edge in time; and
   a monitor circuit configured to determine a relationship between the timing signal and a pulse signal that is produced by the timing control circuit in response to a read request from a memory controller, wherein the monitor circuit includes:
   a first module triggered to a falling edge of the timing signal, the first module being configured to read the pulse signal contemporaneously with the falling edge and generate a first output signal,
   a second module triggered to a rising edge of the timing signal, the second module being configured to read the pulse signal contemporaneously with the rising edge and generate a second output signal, and
   a third module triggered to a second falling edge of the timing signal, the third module being configured to read the pulse signal and the count signal from the counter contemporaneously with the second falling edge and generate a third output signal,
   wherein the relationship between the timing signal and the pulse signal is determined based on the first, second, and third output signals.

2. The system of claim 1, wherein the control signal is further generated based on the pulse signal.

3. The system of claim 1, wherein the gating circuit further includes a delay module configured to delay the timing signal prior to filtering the timing signal using the gating window.

4. The system of claim 3, wherein the timing signal is delayed based on an amount of time between the second edge of the timing signal and the opening of the gating window.

5. The system of claim 1, further comprising:
   a pseudo open drain (POD) circuit configured to cause the timing signal to have a logic level high voltage i) prior to a driving period of the timing signal, and ii) following the driving period of the timing signal.

6. The system of claim 5, wherein the timing signal does not have a tri-state period, the tri-state period being a portion of time in which the timing signal has an intermediate voltage that is neither the logic level high voltage nor a logic level low voltage.

7. The system of claim 1, wherein the gating window is configured to close after a delay that follows the first edge of the timing signal, and wherein the gating window closes during a postamble portion of the timing signal.

8. The system of claim 1, wherein the relationship between the timing signal and the pulse signal is determined by ORing the first, second, and third output signals.

9. The system of claim 8, wherein the gating window is based on the relationship between the timing signal and the pulse signal.

10. The system of claim 1, wherein the counter is configured to, in response to being triggered, count rising edges of the timing signal from an initial count value and to a final count value, and wherein the gating circuit is configured to close the gating window in response to the onset of the first edge of the timing signal when the counter is at the final count value.

11. A method for timing read operations with a memory device, the method comprising:
   receiving a timing signal from the memory device at a gating circuit;
   passing through the timing signal as a filtered timing signal during a gating window, wherein the gating circuit is configured to:
   open the gating window based on a control signal, and
   close the gating window based on a first edge of the timing signal, the first edge being determined based on a counter that is triggered to begin counting by the control signal, wherein the gating window is closed automatically based on an incrementing of the counter and without regard to the control signal;

generating, at a timing control circuit, the control signal based on i) a count signal from the counter, and ii) a second edge of the timing signal that precedes the first edge in time; and determining a relationship between the timing signal and a pulse signal that is produced in response to a read request from a memory controller, by:

triggered by a falling edge of the timing signal, reading the pulse signal contemporaneously with the falling edge and generating a first output signal, triggered by a rising edge of the timing signal, reading the pulse signal contemporaneously with the rising edge and generating a second output signal, and triggered by a second falling edge of the timing signal, reading the pulse signal and the count signal from the counter contemporaneously with the second falling edge and generating a third output signal, wherein the relationship between the timing signal and the pulse signal is determined based on the first, second, and third output signals.

12. The method of claim 11, further comprising:
generating the control signal based on the pulse signal.

13. The method of claim 11, further comprising:
delaying the timing signal prior to filtering the timing signal using the gating window.

14. The method of claim 13, further comprising:
delaying the timing signal based on an amount of time between the second edge of the timing signal and the opening of the gating window.

15. The method of claim 11, further comprising:
setting the timing signal to a logic level high voltage using a pseudo open drain (POD) circuit, wherein the timing signal is set to the logic level high voltage i) prior to a driving period of the timing signal, and ii) following the driving period of the timing signal.

16. The method of claim 15, wherein the timing signal does not have a tri-state period, the tri-state period being a portion of time in which the timing signal has an intermediate voltage that is neither the logic level high voltage nor a logic level low voltage.

17. The method of claim 11, further comprising:
delaying generation of the control signal at the timing control circuit to cause the gating window to open during a preamble portion of the timing signal.

18. The method of claim 11, further comprising:
closing the gating window after a time delay, wherein the time delay follows the first edge of the timing signal, and wherein the gating window closes during a postamble portion of the timing signal.

19. The method of claim 11, wherein the relationship between the timing signal and the pulse signal is determined by ORing the first, second, and third output signals.

20. The method of claim 19, wherein the gating window is based on the relationship between the timing signal and the pulse signal.

* * * * *